(12) United States Patent
Cheng et al.

(10) Patent No.: US 8,610,233 B2
(45) Date of Patent: Dec. 17, 2013

(54) HYBRID MOSFET STRUCTURE HAVING DRAIN SIDE SCHOTTKY JUNCTION

(75) Inventors: Kangguo Cheng, Schenectady, NY (US); Ali Khakifirooz, Mountain View, CA (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 13/049,491

(22) Filed: Mar. 16, 2011

(65) Prior Publication Data

US 2012/0235239 A1    Sep. 20, 2012

(51) Int. Cl.
*H01L 31/102*    (2006.01)

(52) U.S. Cl.
USPC ........... 257/454; 257/471; 257/485; 257/486; 257/E21.634; 257/E21.619; 438/581; 438/630; 438/664

(58) Field of Classification Search
USPC ......... 257/213, 288, 368, 369, 377, 382, 384, 257/413, 414, 428, 431, 449, 453, 454, 455, 257/456, 471, 485, 486, E29.156, E29.161, 257/E21.006, E21.151, E21.164, E21.165, 257/E21.493, E21.634, E21.619; 438/570, 438/571, 572, 573, 576, 580, 581, 582, 583, 438/630, 648, 651, 664
See application file for complete search history.

(56) References Cited

U.S. PATENT DOCUMENTS

| | | | |
|---|---|---|---|
| 4,631,563 A * | 12/1986 | Iizuka | ............................ 257/67 |
| 5,061,981 A | 10/1991 | Hall | |
| 5,177,568 A * | 1/1993 | Honma et al. | ............... 257/295 |
| 6,529,034 B1 | 3/2003 | Ranjan | |
| 6,744,103 B2 | 6/2004 | Snyder | |
| 7,057,302 B2 | 6/2006 | Matsuzawa et al. | |
| 7,183,573 B2 | 2/2007 | Bryant et al. | |
| 7,329,937 B2 | 2/2008 | Nowak | |
| 2006/0125019 A1 * | 6/2006 | Levin et al. | .................. 257/369 |
| 2008/0277735 A1 * | 11/2008 | Ko et al. | ...................... 257/369 |
| 2009/0273040 A1 | 11/2009 | Liang et al. | |

OTHER PUBLICATIONS

J. A. Calviello et al., "A Novel GaAs Schottky-drain Power FET for Microwave Application," IEEE Transactions on Electron Devices, vol. 32, No. 12, 1985, pp. 2844-2847.
M. H. Khater et al., "High-?/Metal-Gate Fully Depleted SOI CMOS With Single-Silicide Schottky Source/Drain With Sub-30-nm Gate Length," IEEE EDL, vol. 31, No. 4, 2010, pp. 275-277.
C. J. Koeneke et al., "Schottky MOSFET for VLSI," IEDM, 1981, pp. 367-370.
B. Lu et al., "Schottky-Drain Technology for AlGaN/GaN High-Electron Mobility Transistors," IEEE Electron Device Letters, vol. 31, No. 4, 2010, pp. 302-304.
C. Zhou et al., "Self-protected GaN Power Devices with Reverse Drain Blocking and Forward Current Limiting Capabilities," ISPSD, 2010, pp. 343-346.

* cited by examiner

*Primary Examiner* — William D Coleman
*Assistant Examiner* — Su Kim
(74) *Attorney, Agent, or Firm* — Cantor Colburn LLP; Vazken Alexanian

(57) ABSTRACT

A method of forming a transistor device includes forming a patterned gate structure over a semiconductor substrate, forming a raised source region over the semiconductor substrate adjacent a source side of the gate structure, and forming silicide contacts on the raised source region, on the patterned gate structure, and on the semiconductor substrate adjacent a drain side of the gate structure. Thereby, a hybrid field effect transistor (FET) structure having a drain side Schottky contact and a raised source side ohmic contact is defined.

21 Claims, 24 Drawing Sheets

HYBRID MOSFET STRUCTURE HAVING DRAIN SIDE SCHOTTKY JUNCTION

BACKGROUND

The present invention relates generally to semiconductor device manufacturing and, more particularly, to a semiconductor device having a hybrid metal oxide semiconductor field effect transistor (MOSFET) structure with a drain side Schottky junction.

In order to be able to fabricate integrated circuit devices with higher integration density than currently feasible, the dimensions of field effect transistors (FETs), such as metal-oxide-semiconductor field effect transistors (MOSFETs) and complementary metal oxide semiconductors (CMOS) must themselves be further downscaled. Scaling achieves compactness and improves operating performance in devices by shrinking the overall dimensions and operating voltages of the device while still maintaining the device's electrical properties. Additionally, all dimensions of the device must be scaled simultaneously in order to optimize the electrical performance of the device.

Very large scale integration (VLSI) processing dictates that active devices be placed close to one another in a dense fashion. As such, dopant regions (i.e., source and drain regions) are implanted at a shallow depth, and are separated from one another by a short channel. The distance between a source region and drain region is often referred to as the physical channel length. However, after implantation and subsequent diffusion of the source region and drain region, the distance between the source region and drain region becomes less than the physical channel length, and is often referred to as the "effective channel length" ($L_{eff}$).

With increased scaling, as the $L_{eff}$ becomes smaller, a well-known phenomena, known as "short channel effect" (SCE) becomes apparent. Generally speaking, SCE impacts device operation by, inter alia, reducing device threshold voltages and increasing subthreshold currents. A problem related to SCE, is the problem of "hot carrier effect" (HCE). HCE is a phenomena by which hot holes and electrons can overcome the potential energy barrier between the silicon and overlying silicon dioxide in order to cause hot carriers to inject into the gate oxide. HCE thereby relates to carrier impact at the substrate topography, whereas SCE relates to carrier impact within the substrate itself.

Additionally, there are significant challenges in designing the electrical characteristics of semiconductor devices, wherein the nature of the inverse relationship between resistance and capacitance makes it difficult to minimize the overall parasitic resistance of the semiconductor device, while also minimizing overall capacitance of the semiconductor device.

SUMMARY

In one aspect, a method of forming a transistor device includes forming a patterned gate structure over a semiconductor substrate; forming a raised source region over the semiconductor substrate adjacent a source side of the gate structure; and forming silicide contacts on the raised source region, on the patterned gate structure, and on the semiconductor substrate adjacent a drain side of the gate structure, thereby defining a hybrid field effect transistor (FET) structure having a drain side Schottky contact and a raised source side ohmic contact.

In another aspect, a transistor device includes a patterned gate structure formed over a semiconductor substrate; a raised source region formed over the semiconductor substrate adjacent a source side of the gate structure; and silicide contacts formed on the raised source region, on the patterned gate structure, and on the semiconductor substrate adjacent a drain side of the gate structure, thereby defining a hybrid field effect transistor (FET) structure having a drain side Schottky contact and a raised source side ohmic contact.

In still another aspect, an integrated circuit device includes a first transistor and a second transistor formed over a semiconductor substrate, the first transistor comprising a hybrid field effect transistor (FET) structure having a drain side Schottky contact and a raised source side ohmic contact; and the second transistor having both raised source side and drain side ohmic contacts.

BRIEF DESCRIPTION OF THE SEVERAL VIEWS OF THE DRAWINGS

Referring to the exemplary drawings wherein like elements are numbered alike in the several Figures:

FIGS. 1 through 7 are cross sectional views of a first exemplary embodiment of a method of forming a hybrid MOSFET structure with a drain side Schottky junction, in which:

FIG. 1 illustrates a pair of gate structures formed on a silicon-on-insulator (SOI) substrate;

FIG. 2 illustrates the formation of a hardmask layer over the structure of FIG. 1;

FIG. 3 illustrates a tilted ion implant of the structure of FIG. 2, shadowing drain regions;

FIG. 4 illustrates the removal of damaged portions of the hardmask caused by the ion implant of FIG. 3;

FIG. 5 illustrates the growth of an epitaxial semiconductor layer over locations of the SOI substrate where the damaged hardmask was removed in FIG. 4;

FIG. 6 illustrates the removal of the remaining portions of the undamaged hardmask from the structure in FIG. 5;

FIG. 7 illustrates the formation of silicide contacts on the gate, source and drain regions of the structure of FIG. 6, resulting in a hybrid MOSFET structure with a raised source and drain side Schottky contact;

FIGS. 8 through 11 are cross sectional views of a second exemplary embodiment of a method of forming a hybrid MOSFET structure with a drain side Schottky junction, in which:

FIG. 8 illustrates a pair of gate structures formed on a silicon-on-insulator (SOI) substrate;

FIG. 9 illustrates a ion implantation of the device of FIG. 8, which results in shallow amorphous regions corresponding to drain locations;

FIG. 10 illustrates the growth of an epitaxial semiconductor layer over locations of the SOI substrate not made amorphous by the implant of FIG. 9;

FIG. 11 illustrates the formation of silicide contacts on the gate, source and drain regions of the structure of FIG. 10, resulting in a hybrid MOSFET structure with a raised source and drain side Schottky contact;

FIGS. 12 through 16 are cross sectional views of a third exemplary embodiment of a method of forming a hybrid MOSFET structure with a drain side Schottky junction, in which:

FIG. 12 illustrates a pair of gate structures formed on a silicon-on-insulator (SOI) substrate;

FIG. 13 illustrates the growth of an epitaxial semiconductor layer over the SOI substrate of the structure of FIG. 12;

FIG. 14 illustrates a tilted ion implant of the structure of FIG. 13, shadowing drain regions;

FIG. 15 illustrates the removal of damaged portions of the epitaxial semiconductor layer caused by the ion implant of FIG. 14;

FIG. 16 illustrates the formation of silicide contacts on the gate, source and drain regions of the structure of FIG. 15, resulting in a hybrid MOSFET structure with a raised source and drain side Schottky contact;

FIGS. 17 through 23 are cross sectional views of a fourth exemplary embodiment of a method of forming a hybrid MOSFET structure with a drain side Schottky junction, in which:

FIG. 17 illustrates a pair of gate structures formed on a silicon-on-insulator (SOI) substrate;

FIG. 18 illustrates the growth of an epitaxial semiconductor layer over the SOI substrate of the structure of FIG. 17;

FIG. 19 illustrates the formation of a hardmask layer over the structure of FIG. 18;

FIG. 20 illustrates a tilted ion implant of the structure of FIG. 19, shadowing drain regions;

FIG. 21 illustrates the removal of damaged portions of the hardmask caused by the ion implant of FIG. 20, as well as the removal of exposed portions of the epitaxial semiconductor layer;

FIG. 22 illustrates the removal of the remaining portions of the undamaged hardmask from the structure in FIG. 21;

FIG. 23 illustrates the formation of silicide contacts on the gate, source and drain regions of the structure of FIG. 22, resulting in a hybrid MOSFET structure with a raised source and drain side Schottky contact.

DETAILED DESCRIPTION

Schottky MOSFETs (i.e., MOSFETs having Schottky barriers versus ohmic contacts) are of interest when fabricated in conjunction with thin channel SOI devices. More specifically, Schottky barriers may eliminate the need to form raised source/drain (S/D) structures, which in turn lead to higher parasitic capacitance. On the other hand, the series resistance of Schottky MOSFETs (i.e., Schottky barrier source/drain contacts for thin SOI substrates) is still somewhat higher than for conventional MOSFETs, such as raised source/drain devices.

Accordingly, disclosed herein is a hybrid MOSFET structure that incorporates a Schottky junction only on the drain side of the FET, where parasitic capacitance is more significant due to the Miller effect. Conversely, a more conventional raised ohmic junction is incorporated on the source side where series resistance is more significant. As is illustrated in further detail below, several embodiments are contemplated for fabricating such hybrid MOSFET structures. Although the embodiments described therein illustrate a planar FET structure with a thin channel, it will be appreciated that the principles are equally applicable to other device structures.

Referring initially to FIGS. 1 through 7, there are shown a series of cross sectional views of a first exemplary embodiment of a method of forming a hybrid MOSFET structure with a drain side Schottky junction. As initially shown in FIG. 1, a starting structure 100 includes a bulk substrate 102, a buried insulator layer (e.g., a buried oxide or "BOX" layer) 104 formed on the bulk substrate 102, and a silicon-on-insulator (SOI) layer 106 formed on the BOX layer 104. Those skilled in the art will recognized that other suitable semiconductor and insulator layers may also be used in the formation of an SOI substrate. In the embodiment depicted, the SOI layer 106 is an extremely thin SOI (ETSOI) layer having an exemplary thickness range on the order of about 4 nanometers (nm) to about 12 nm, and more specifically about 8 nm.

Figure 1:
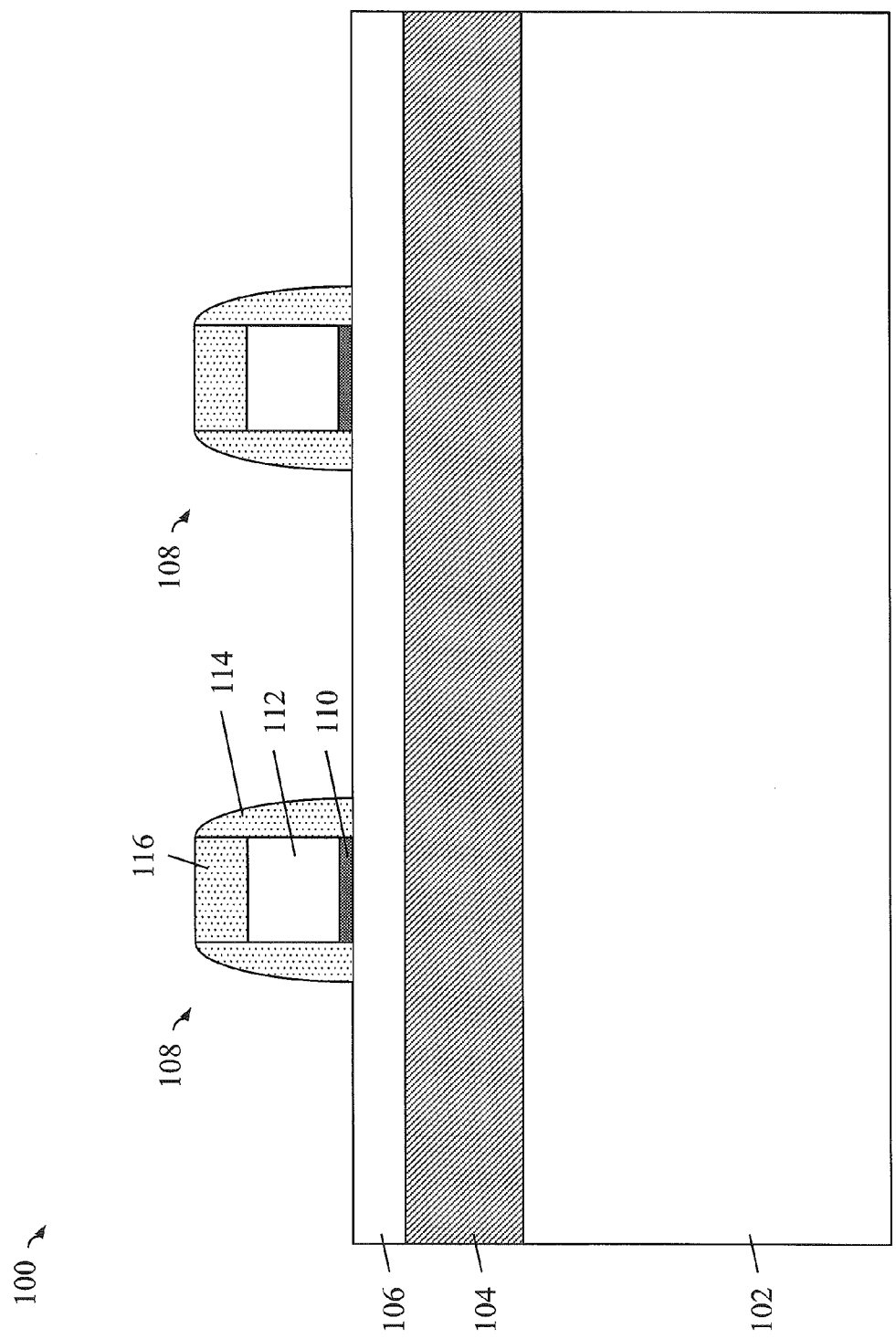

FIG. 1 also illustrates the formation of a pair of patterned FET gate structures 108 on the SOI layer 106. The gate structures 108 include a gate dielectric layer 110 (e.g., oxide, nitride, oxynitride, high-K material, etc.) formed on the SOI layer 106, a gate conductor layer 112 (e.g., polysilicon, metal or combination thereof, etc.) formed on the gate dielectric layer 110, and sidewall spacers 114 (e.g., nitride) formed on sidewalls of the gate dielectric layer 110 and gate conductor layer 112. In addition, a protective gate hardmask layer 116 (e.g., an oxide) is also included atop the gate conductor layer 112 so as to protect the gate structure during the remaining FET processing operations, as described hereafter.

Figure 2:
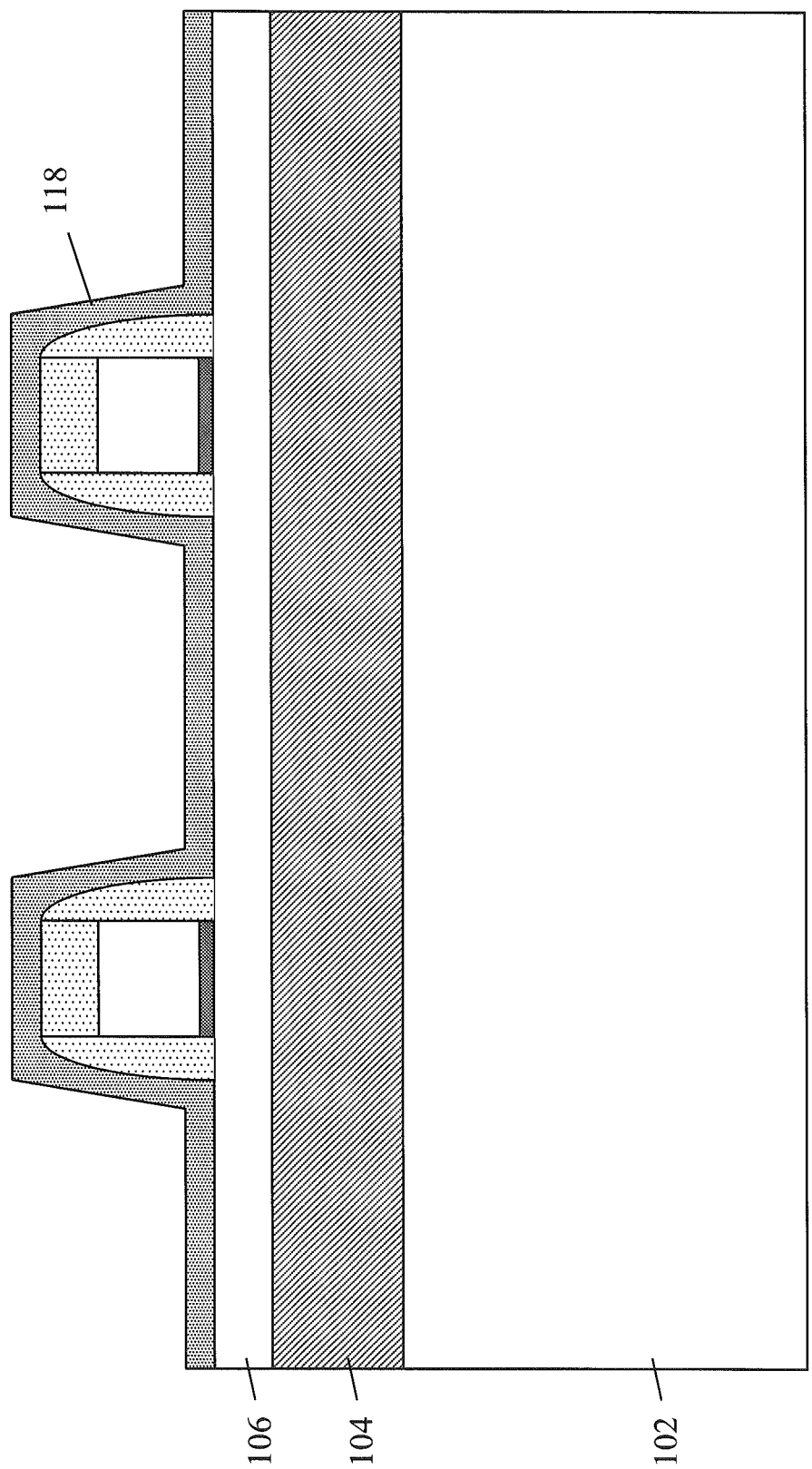
Figure 3:
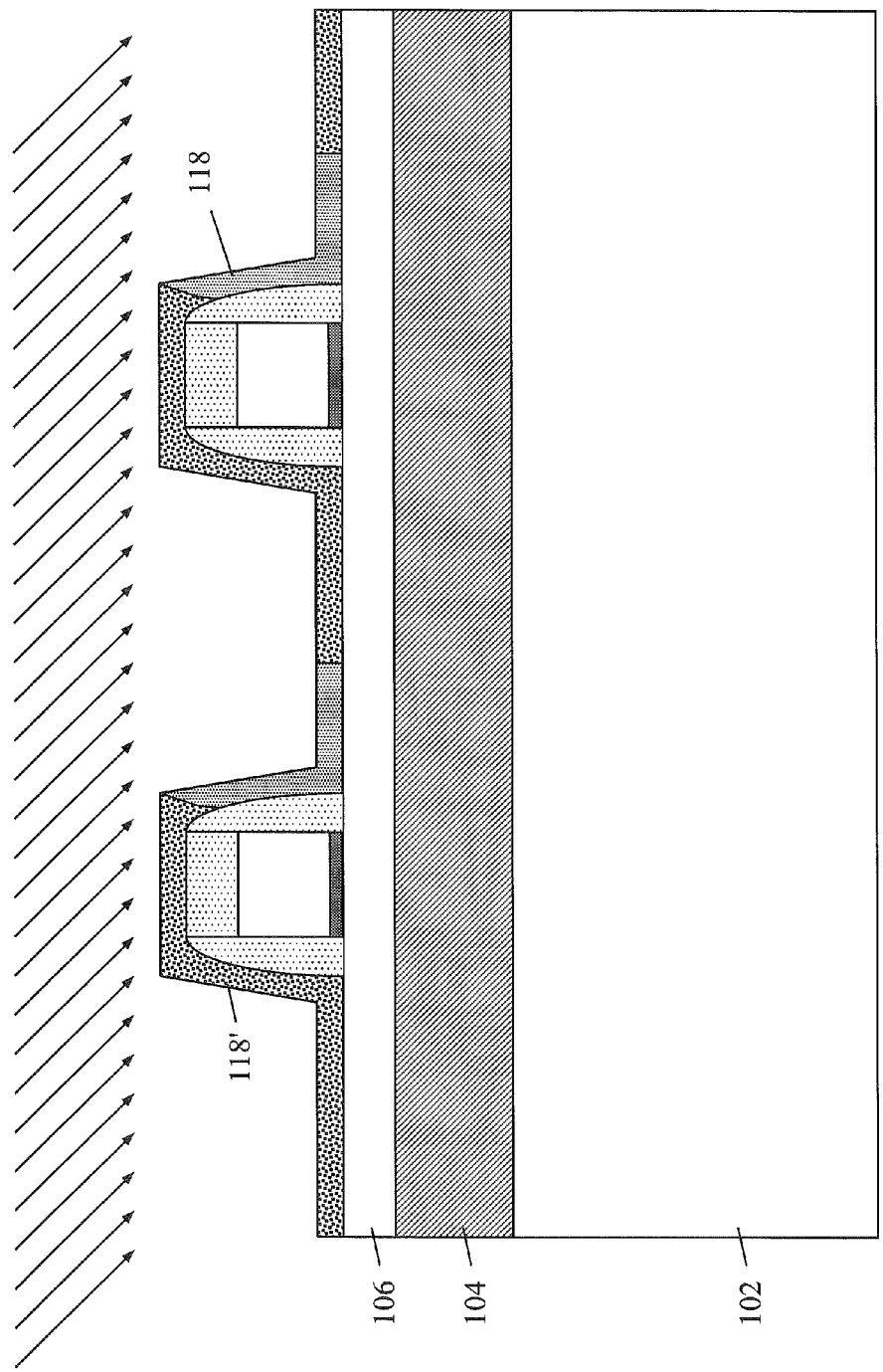

As then shown in FIG. 2, a hardmask layer 118 is formed over the entire structure. The hardmask 118 may be, for example, an oxide or a nitride material, but in any case preferably has good etch selectivity with respect to the sidewall spacers 114. In FIG. 3, the device is subjected to a tilted ion implant indicated by the arrows, which results in damaged portions 118' of the hardmask layer 118. The ion implant species may be an electrically neutral species (e.g., germanium, xenon, etc.), and is implanted under energy and angle conditions designed to localize the ion species into the hardmask layer 118 (i.e., the implant species does not substantially penetrate into the SOI layer 104). Moreover, the implant angle results in shadowing of the drain regions of the FET structures such that the portions of the hardmask 118 above the drain regions are substantially undamaged.

Figure 4:
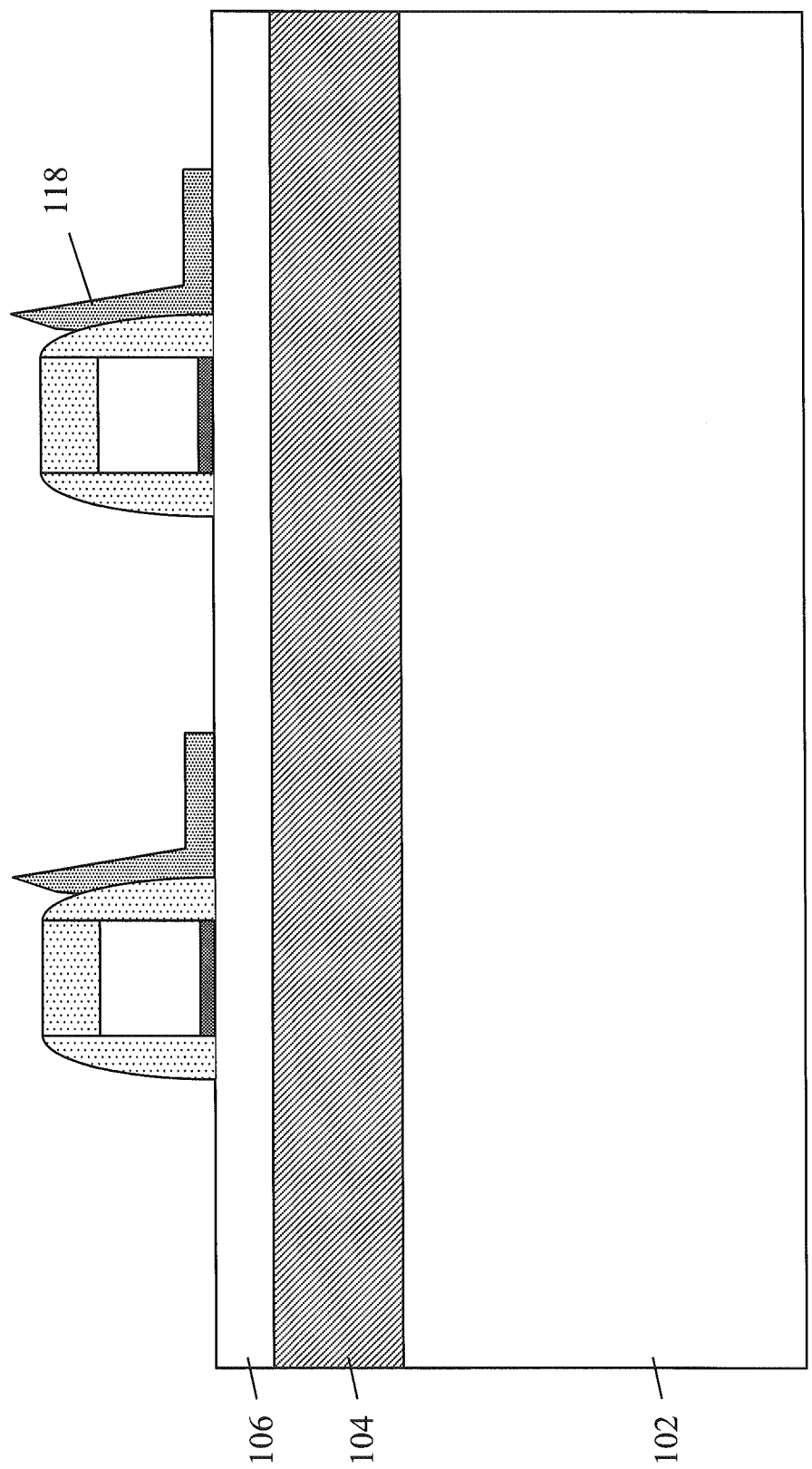
Figure 5:
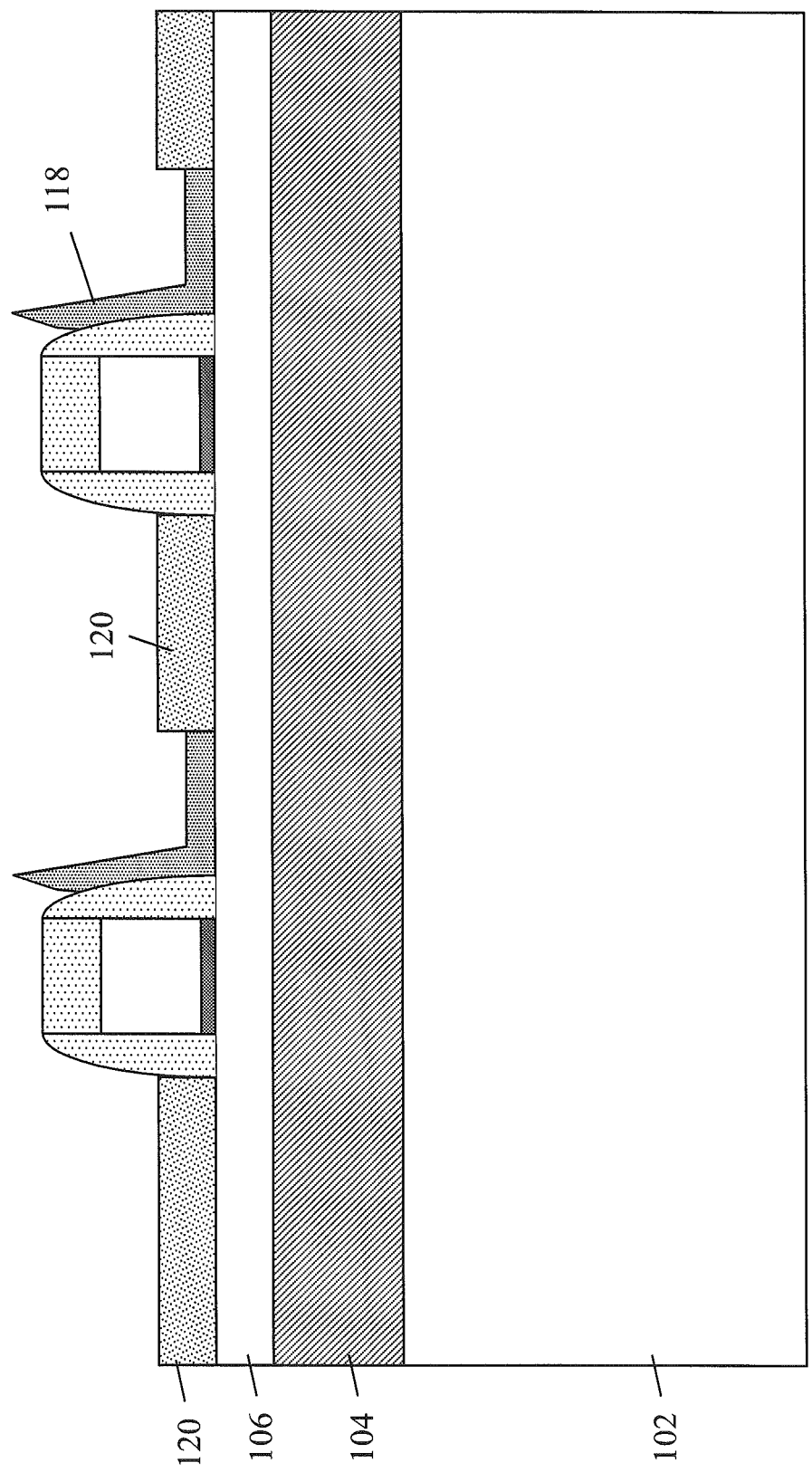
Figure 6:
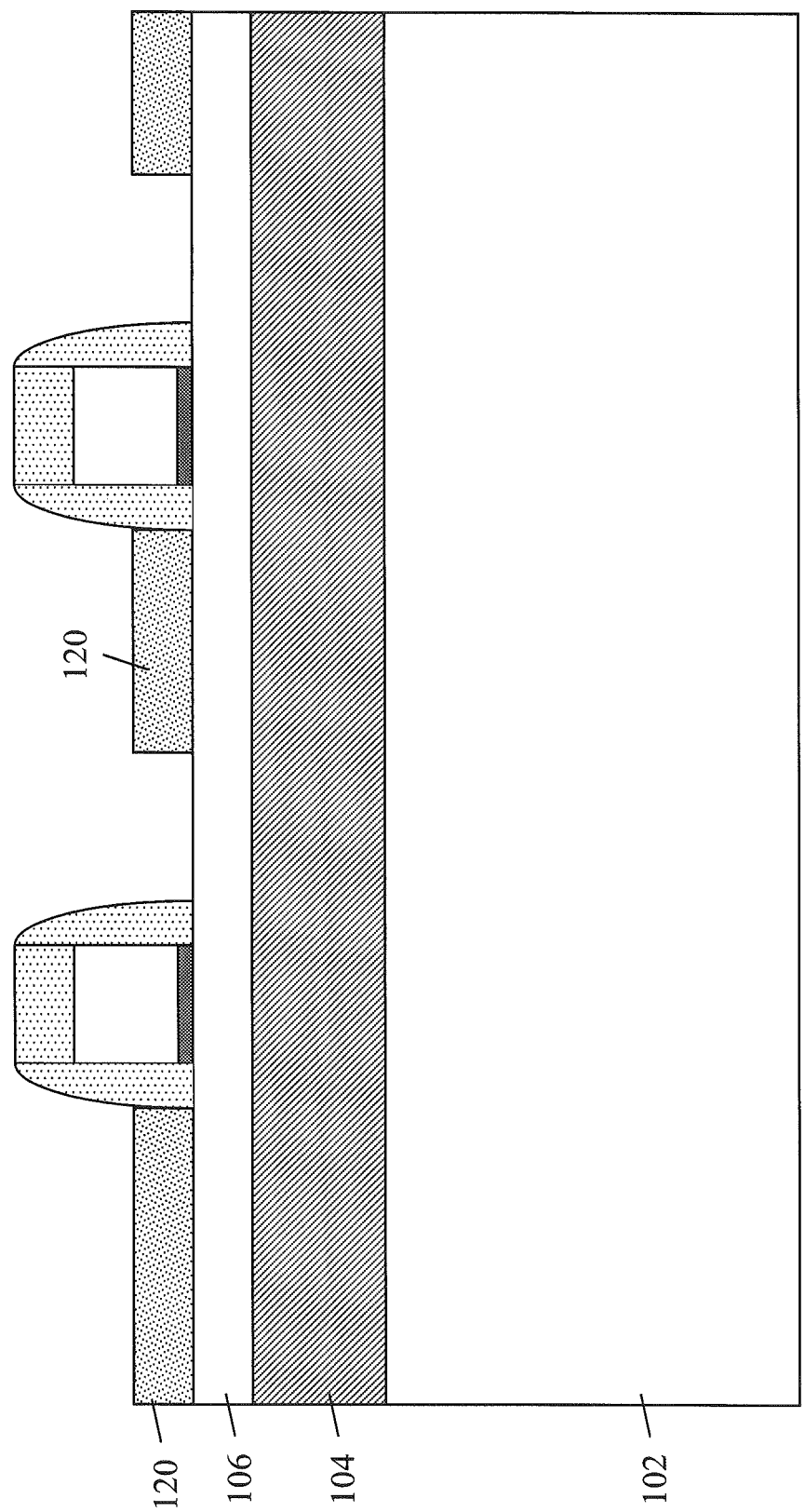

In FIG. 4, the damaged portions 118' of the hardmask layer 118 are removed by a suitable selective etch, since the implantation process of FIG. 3 alters the etch selectivity of the damaged portions 118' of the hardmask layer 118. This results in exposure of the SOI layer 104 at source regions of the FET structures, while the drain regions of the FET structures remain covered by the remaining portions of the hardmask layer 118. Then, as shown in FIG. 5, an epitaxial semiconductor layer 120 is grown over exposed portions of the SOI layer 104, thereby resulting in raised source regions. Doping of the raised source regions 120 may be performed in situ or, alternatively, by implanting following removal of the remaining hardmask layer 118 in FIG. 6. removed by a suitable selective etch, since the implantation process of FIG. 3 alters the etch selectivity of the damaged portions 118' of the hardmask layer 118. This results in exposure of the SOI layer 104 at source regions of the FET structures, while the drain regions of the FET structures remain covered by the remaining portions of the hardmask layer 118. Then, as shown in FIG. 5, an epitaxial semiconductor layer 120 is grown over exposed portions of the SOI layer 104, thereby resulting in raised source regions. Doping of the raised source regions 120 may be performed in situ or, alternatively, by implanting following removal of the remaining hardmask layer 118 in FIG. 6.

Figure 7:
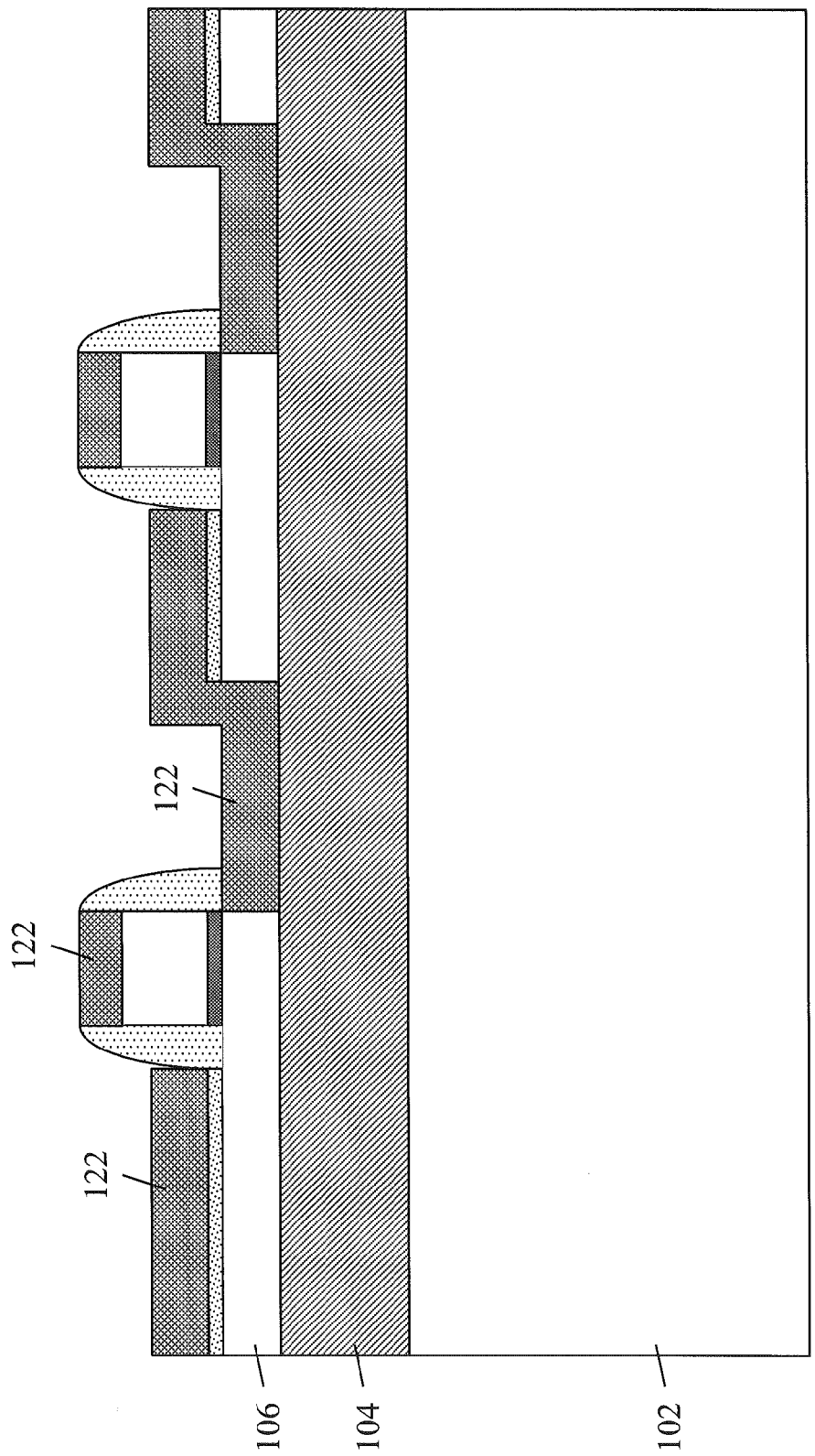

Finally, as shown in FIG. 7, upon removal of the protective gate hardmask layer, a silicide material 122 (e.g., cobalt silicide, platinum silicide, nickel silicide, erbium silicide, etc.) is formed over the gate, raised source, and drain regions, thereby forming a hybrid MOSFET structure having a drain side Schottky junction. The Schottky barrier height at the silicide-silicon interface on the drain side depends on the metal work function. Optionally, the silicide material 122 may be formed with an implant and dopant segregation to lower the barrier height and hence the access resistance on the drain side of the transistor. Due to the extreme thinness of the SOI layer 104, substantially all of the silicon semiconductor material may be consumed by the silicide process. However, it will be appreciated that the above techniques could also be applied to partially depleted SOI substrates, as well as fin-shaped FET (FINFET) devices.

Figure 8:
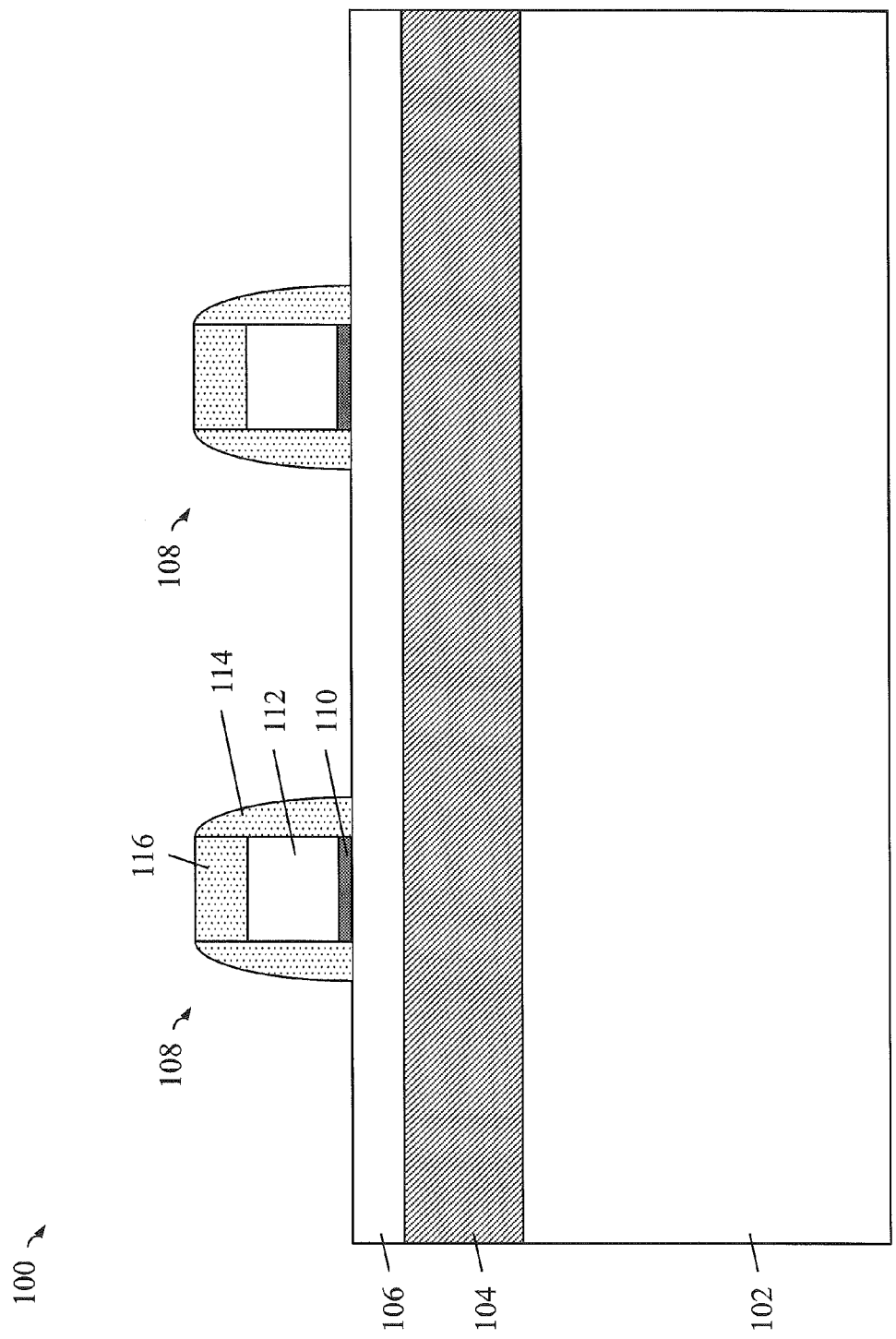

Referring now to FIGS. 8 through 11, there are shown a series of cross sectional views of a second exemplary embodiment of a method of forming a hybrid MOSFET structure with a drain side Schottky junction. For ease of description, like elements with respect to the several embodiments are designated with the same reference numbers. Thus, FIG. 8 illustrates a starting structure 100 substantially similar to that of FIG. 1, and which structure 100 includes a bulk substrate 102, a BOX layer 104 formed on the bulk substrate 102, and an SOI layer 106 formed on the BOX layer 104.

Figure 9:
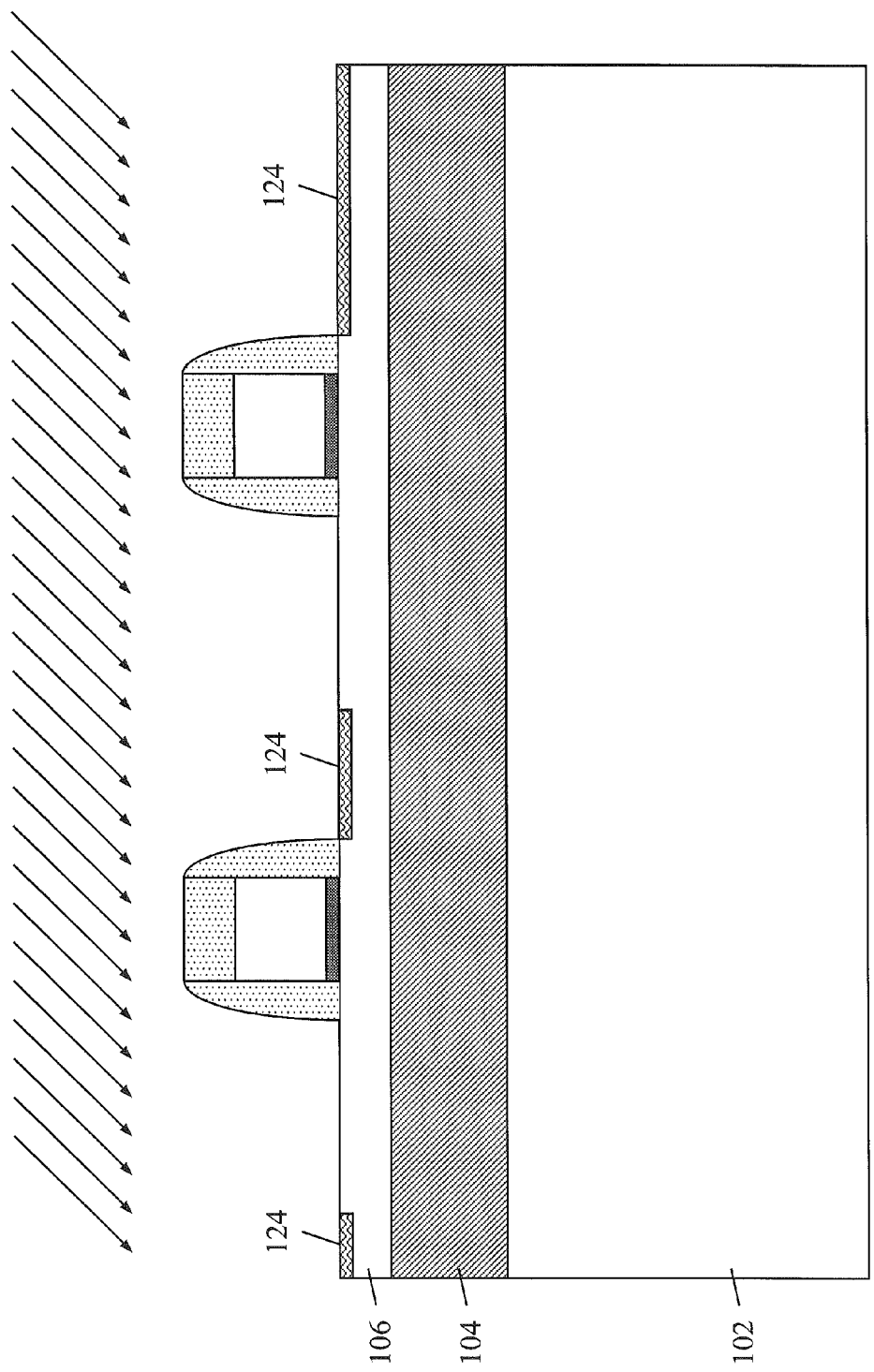
Figure 10:
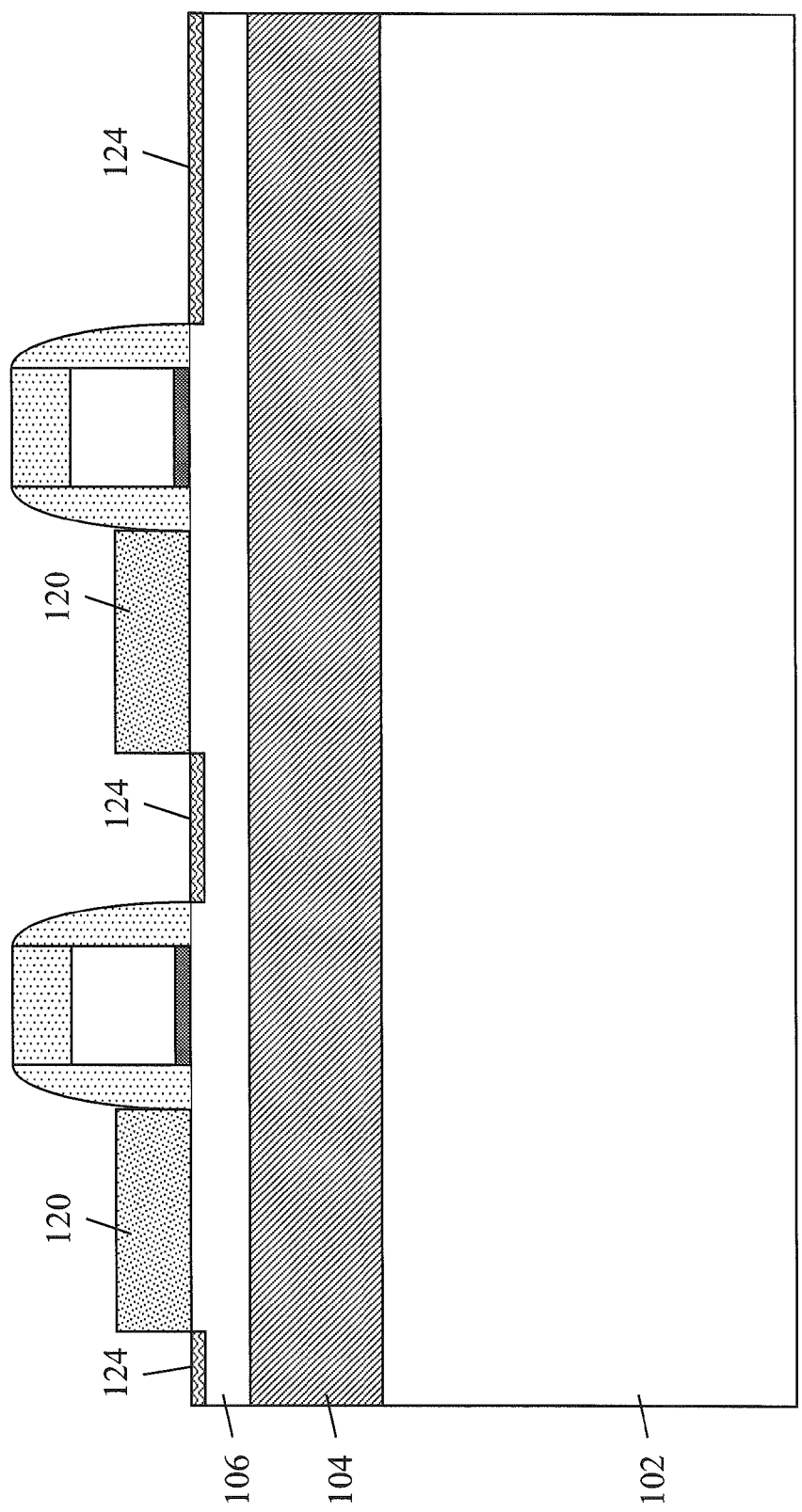
Figure 11:
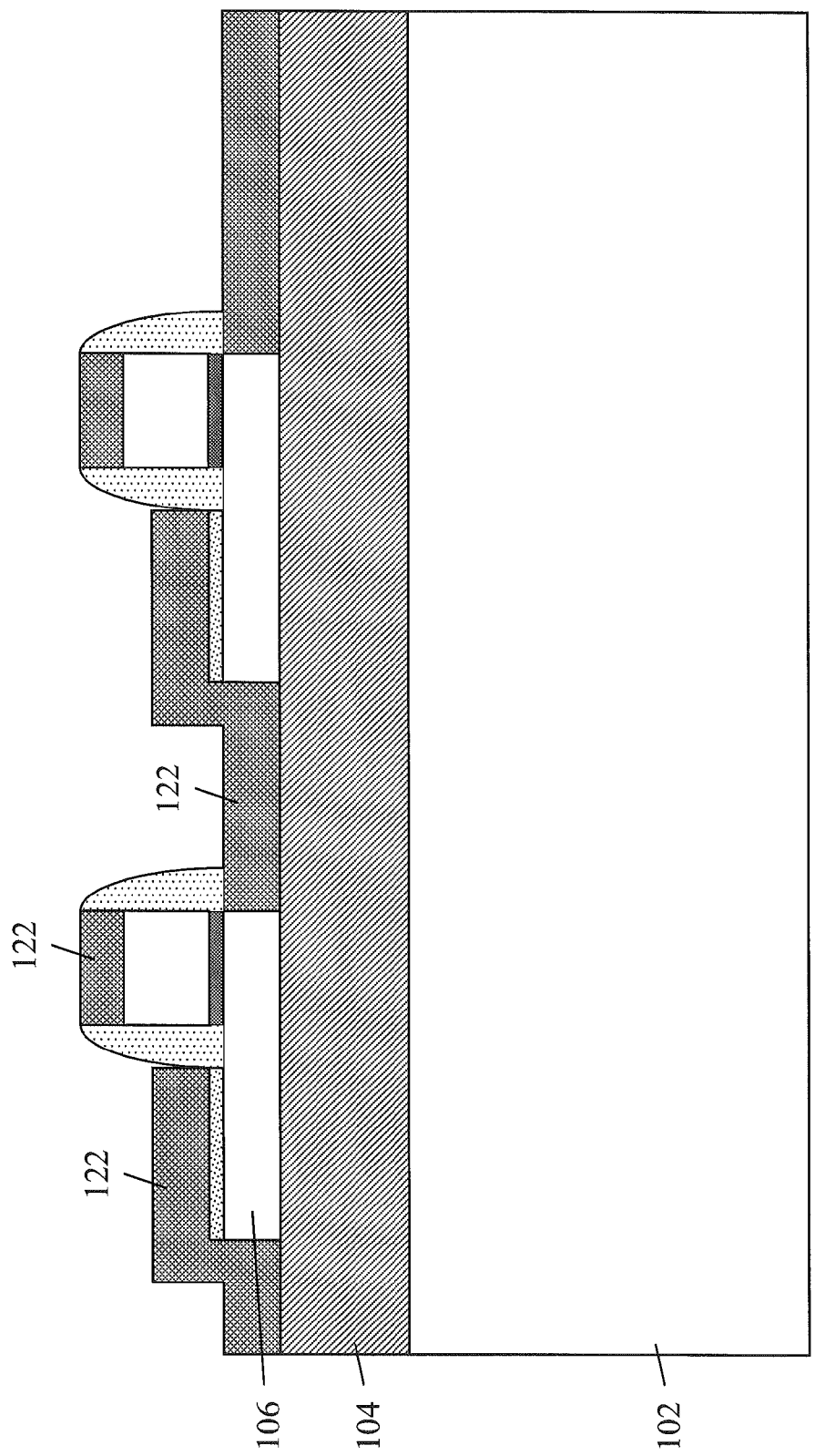

In this embodiment, following the formation of the initial FET gate structures 108, an angled implant is used to amorphize or modify upper portions 124 of the SOI layer 104 not shadowed by the gate structures, as shown in FIG. 9. Here, such modified upper portions 124 correspond to drain regions of the FET. In this manner, when a semiconductor epitaxial growth process is performed, as shown in FIG. 10, the epitaxially grown semiconductor material 120 is formed on the shadowed source regions where the crystal structure of the SOI layer 104 was not modified by the angled implant. With the raised source regions 120 in place, and with the removal of the protective gate hardmask layer, a silicide material 122 is formed over the gate, raised source, and drain regions, thereby forming a hybrid MOSFET structure having a drain side Schottky junction in FIG. 11.

Figure 12:
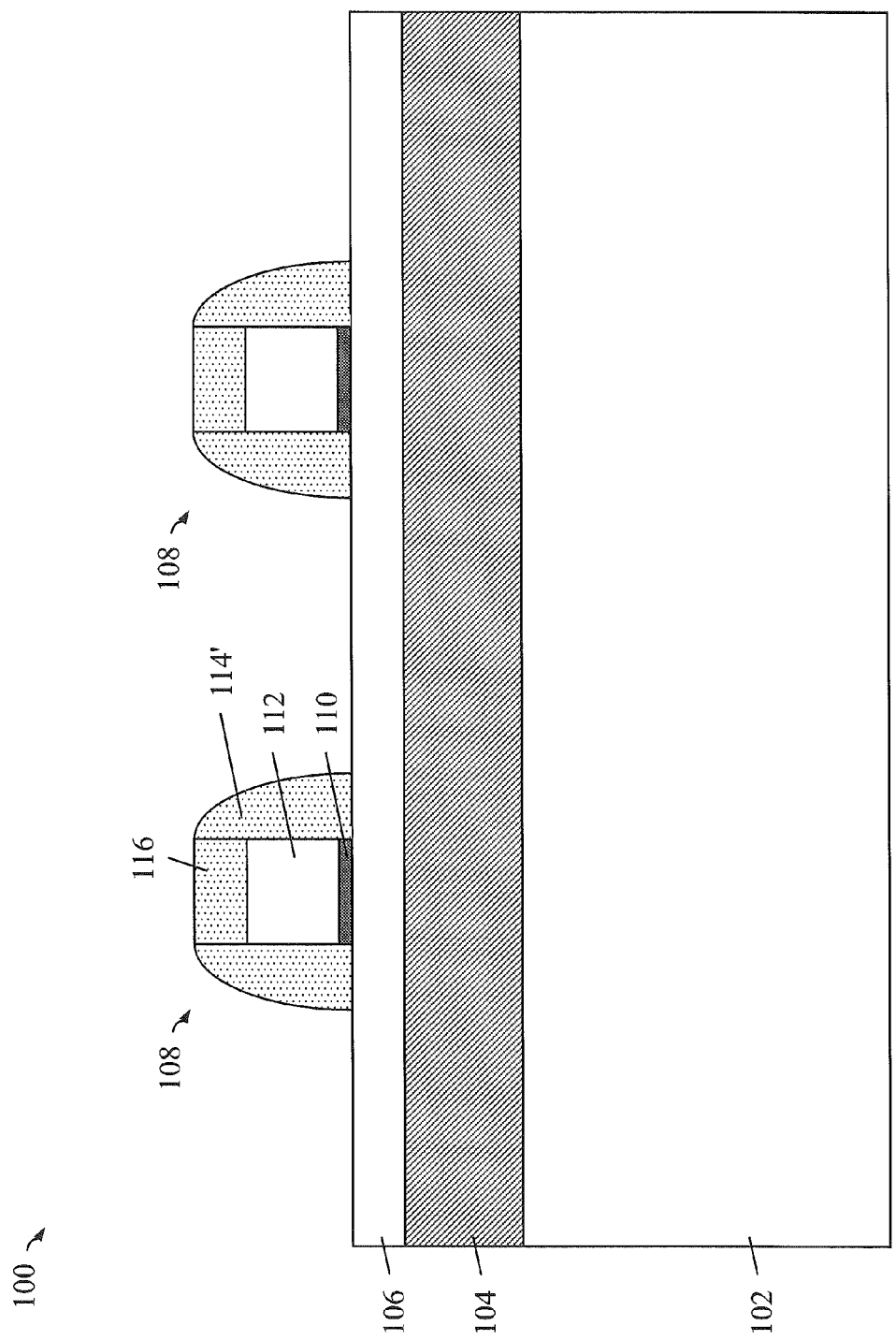
Figure 13:
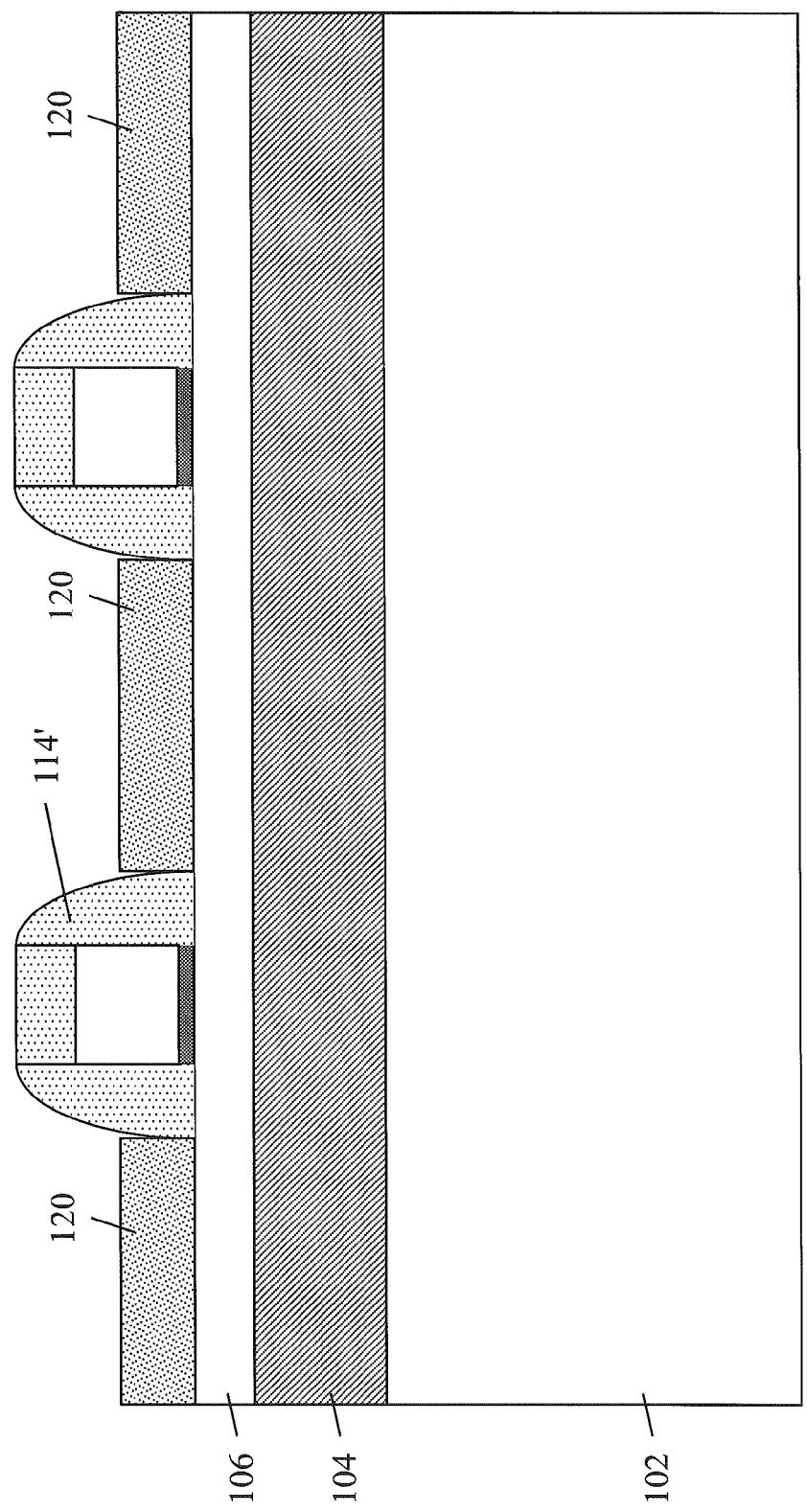
Figure 14:
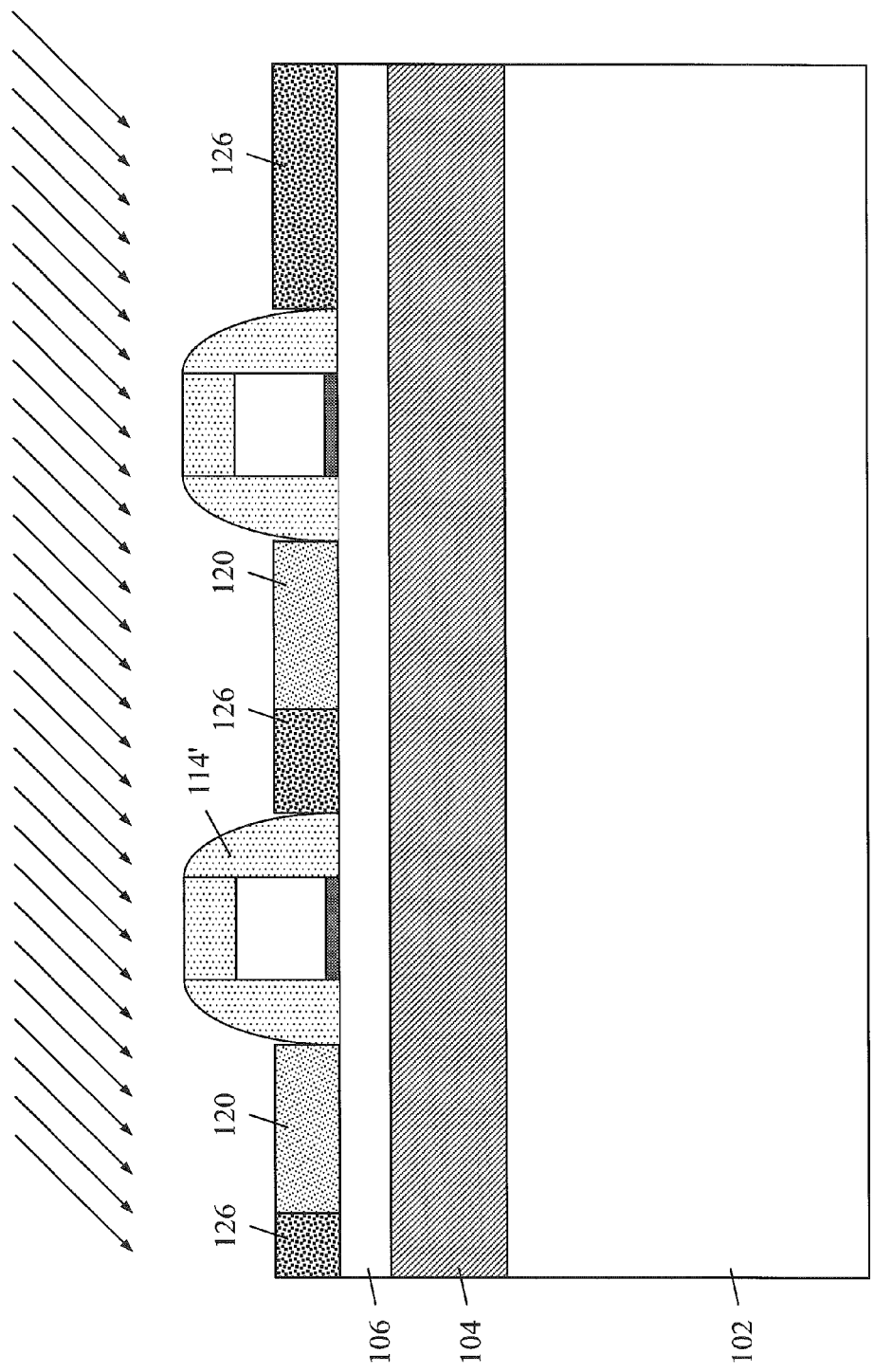

Referring now to FIGS. 12 through 16, there are shown a series of cross sectional views of a third exemplary embodiment of a method of forming a hybrid MOSFET structure with a drain side Schottky junction. FIG. 12 illustrates a starting structure 100 substantially similar to that of FIG. 1 and FIG. 8, with the exception that the sidewall spacers 114' are initially slightly larger than those of spacers 114 in FIGS. 1 and 8. In FIG. 13, an epitaxial growth process forms an epitaxial semiconductor layer 120 on the entirety of the exposed SOI layer 104 not covered by gate structures. Then, as shown in FIG. 14, an angled implant is used to modify portions 126 of the epitaxial semiconductor layer 120 not shadowed by the gate structures, altering the etch properties thereof. In addition, the angled implant also modifies the etch properties of the drain side spacers 114'.

Figure 15:
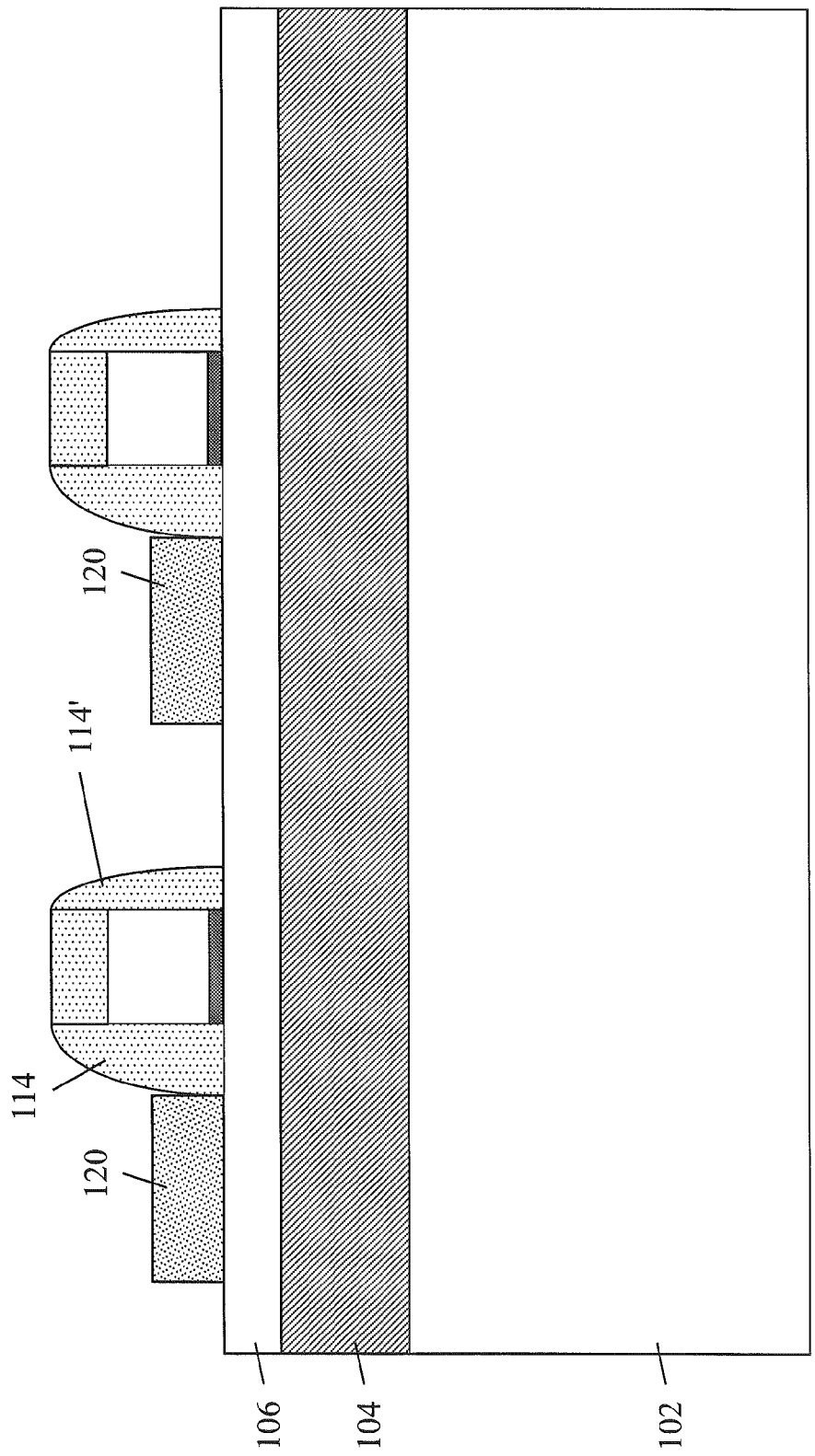
Figure 16:
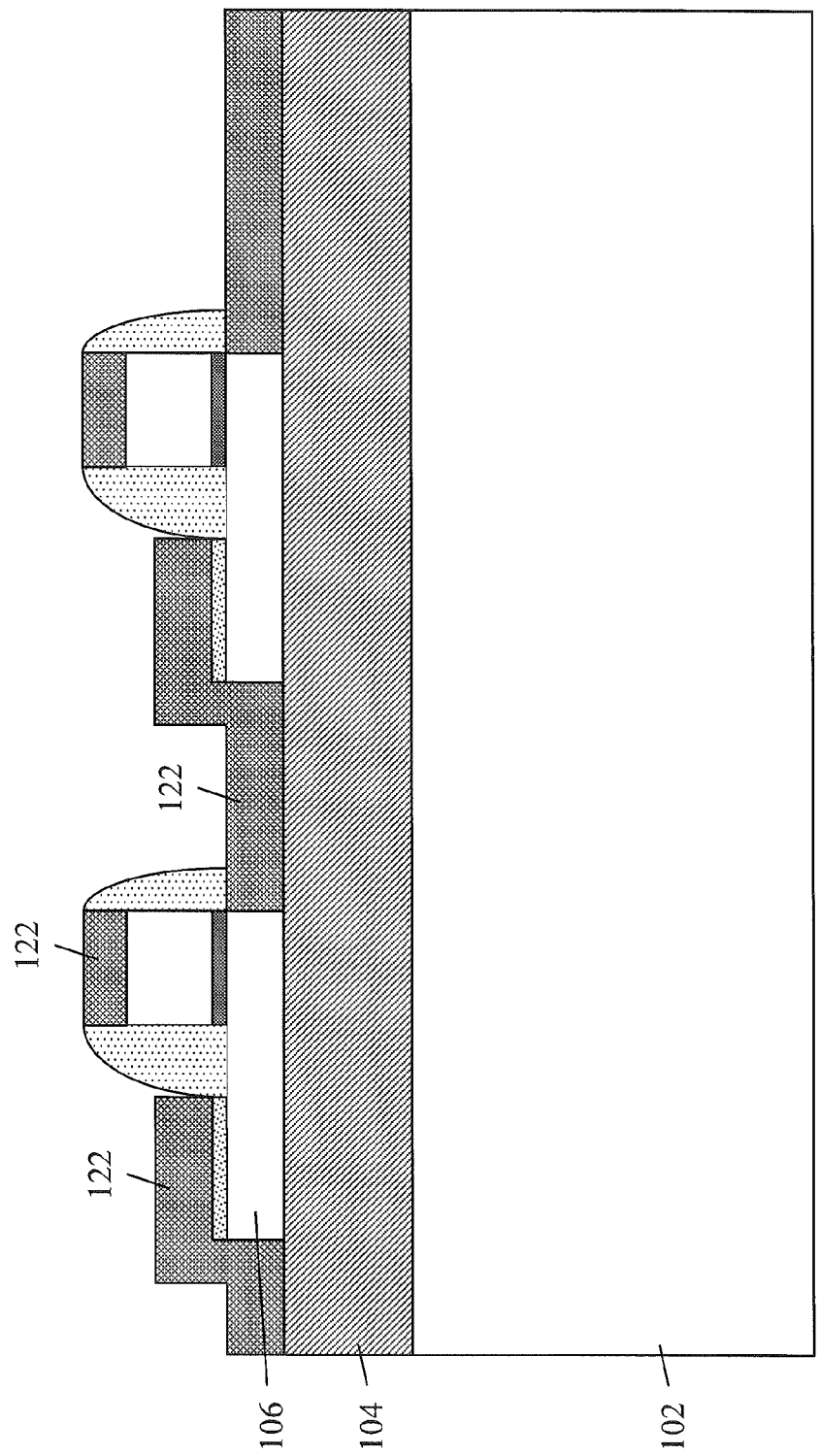

The modified portions 126 of the semiconductor layer 120 corresponding to drain regions are removed, such as by etching, as shown in FIG. 15, which leaves the raised source side semiconductor regions of the semiconductor layer 120. In addition, another etch process may be used to thin the drain side spacers 114'. In this embodiment, the two etch removal processes may be done in either order. Further, another option is to form the gate sidewall spacers at the same thickness as in FIGS. 1 and 8, deposit the epitaxial semiconductor layer as in FIG. 13, perform the angled implant as in FIG. 14, and remove the damaged portions of the epitaxial semiconductor layer as in FIG. 15. In either case, subsequent to the removal of the protective gate hardmask layer, a silicide material 122 is formed over the gate, raised source, and drain regions, thereby forming a hybrid MOSFET structure having a drain side Schottky junction as shown in FIG. 16.

Figure 17:
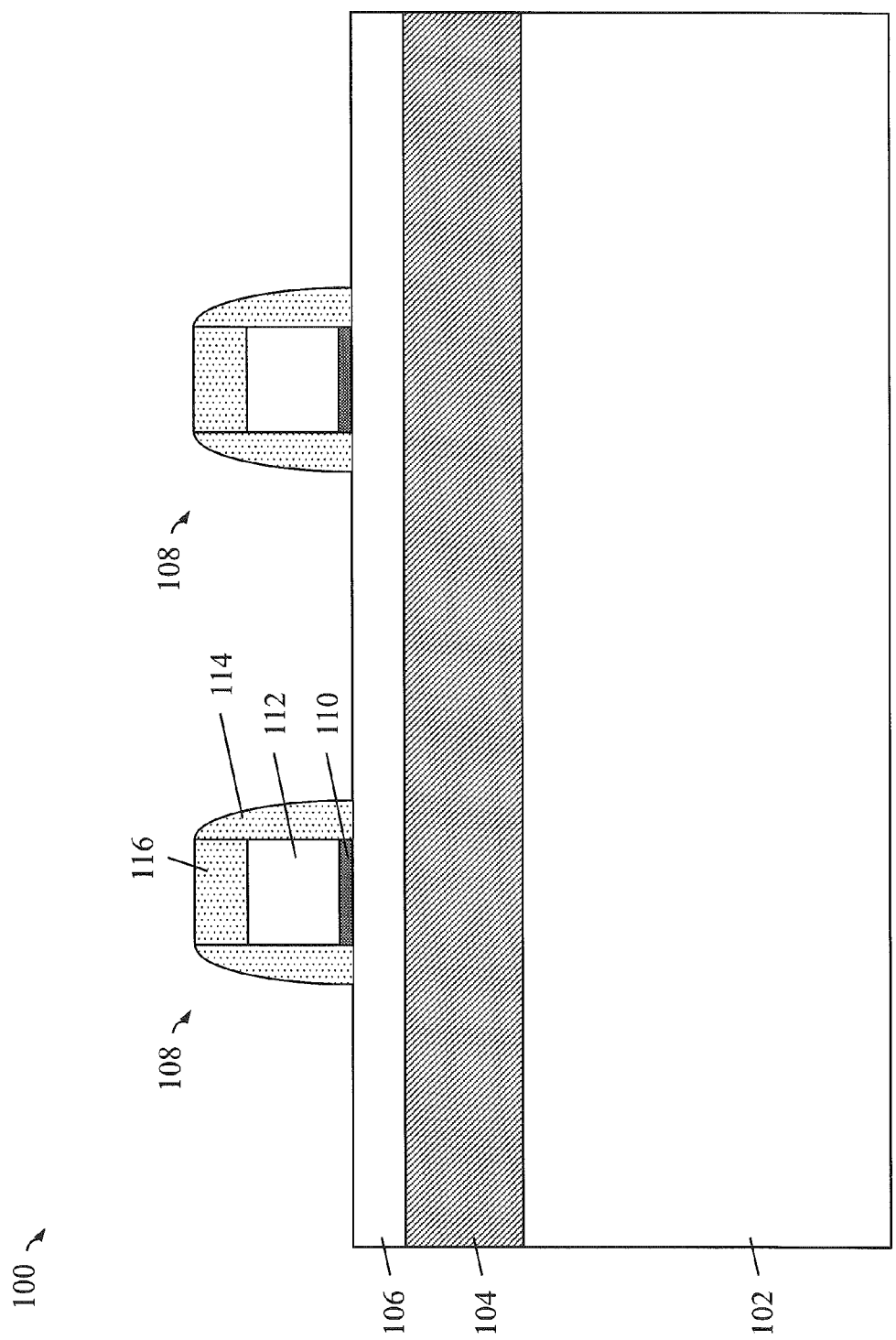
Figure 18:
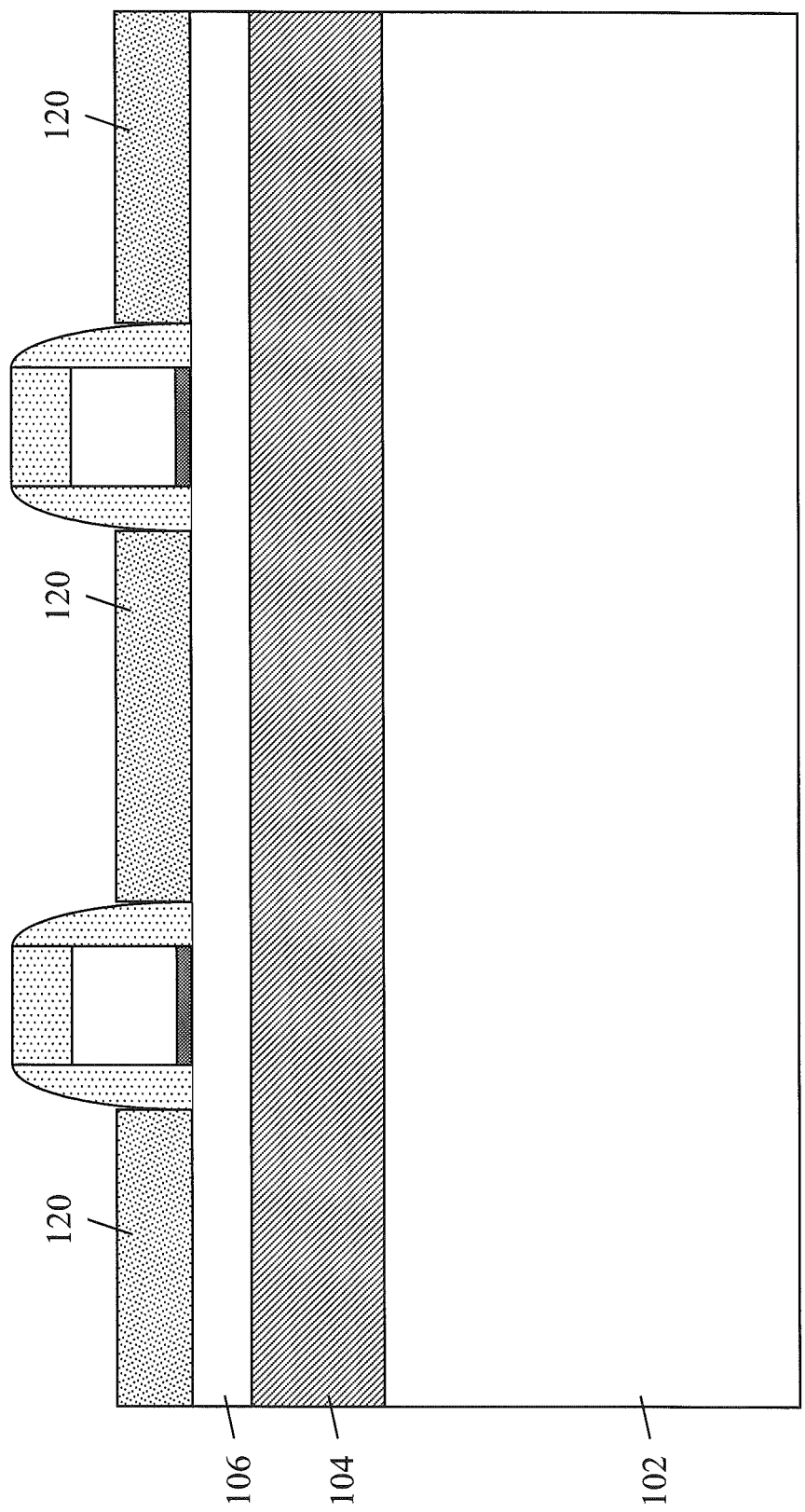
Figure 19:
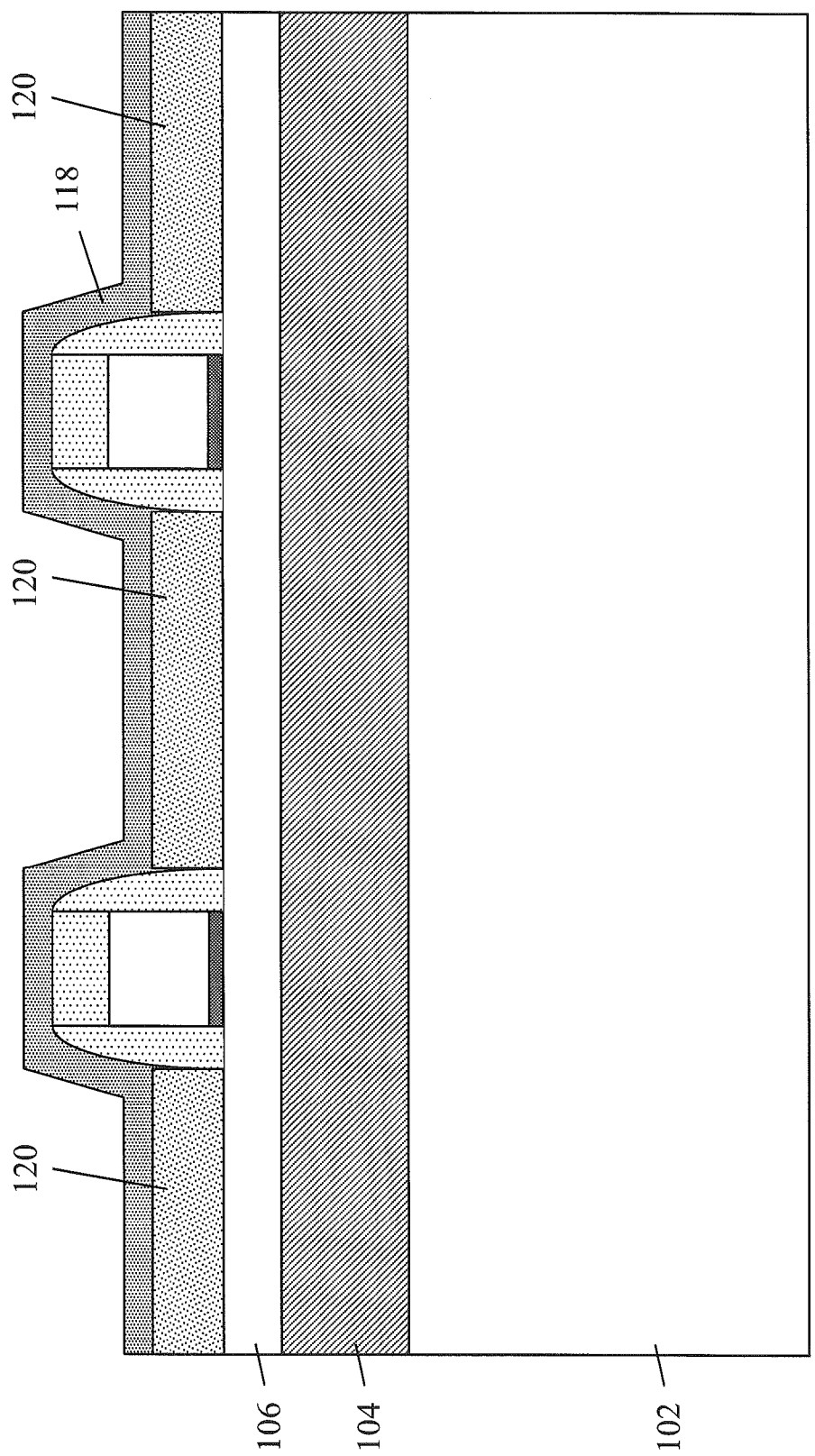

Referring now to FIGS. 17 through 23, there are shown a series of cross sectional views of a fourth exemplary embodiment of a method of forming a hybrid MOSFET structure with a drain side Schottky junction. FIG. 17 illustrates a starting structure 100 substantially similar to that of FIG. 1 and FIG. 8. In FIG. 18, an epitaxial growth process forms an epitaxial semiconductor layer 120 on the entirety of the exposed SOI layer 104 not covered by gate structures. This is followed by forming a hardmask layer 118 over the entire structure, as shown in FIG. 19.

Figure 20:
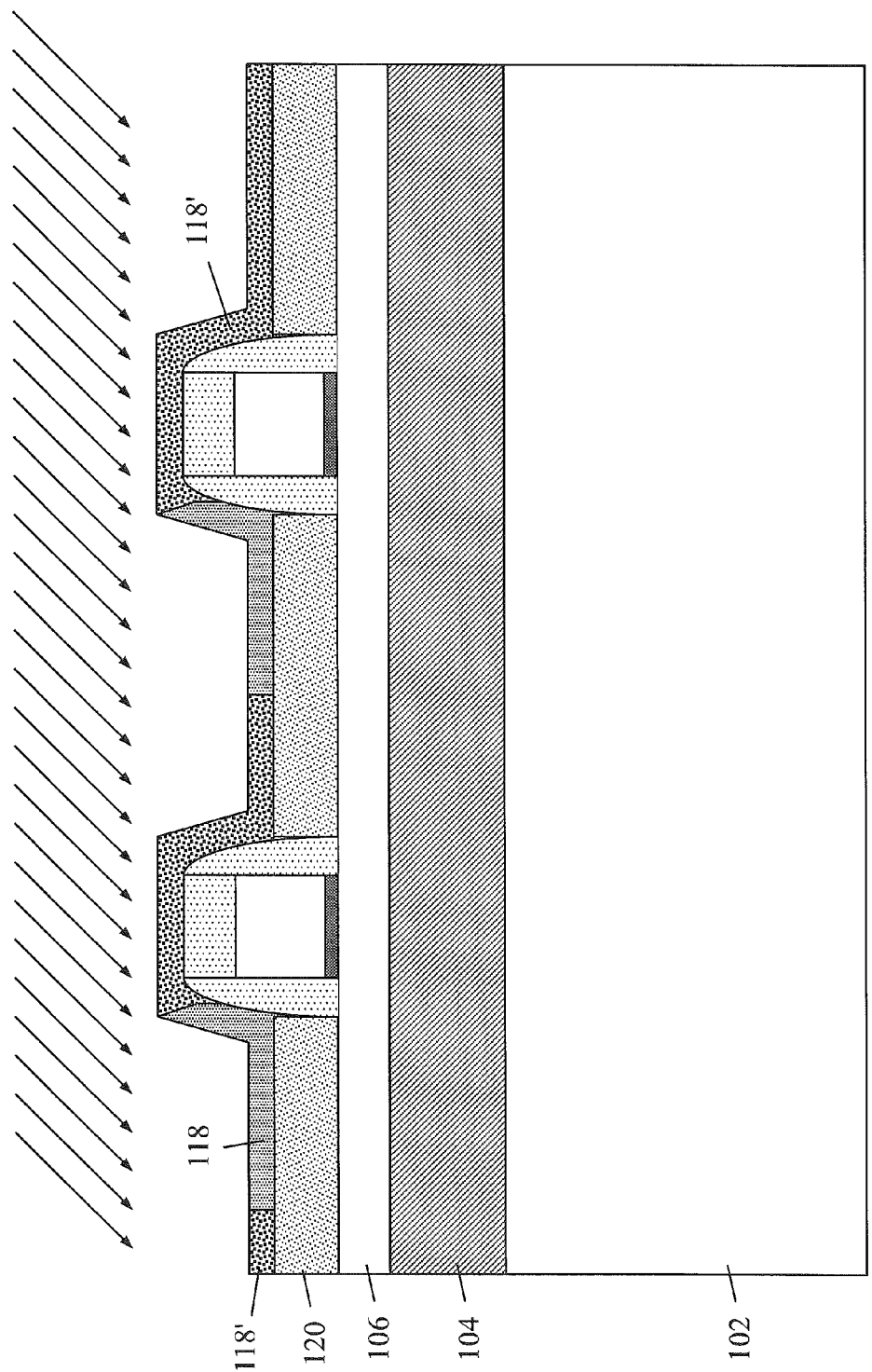
Figure 21:
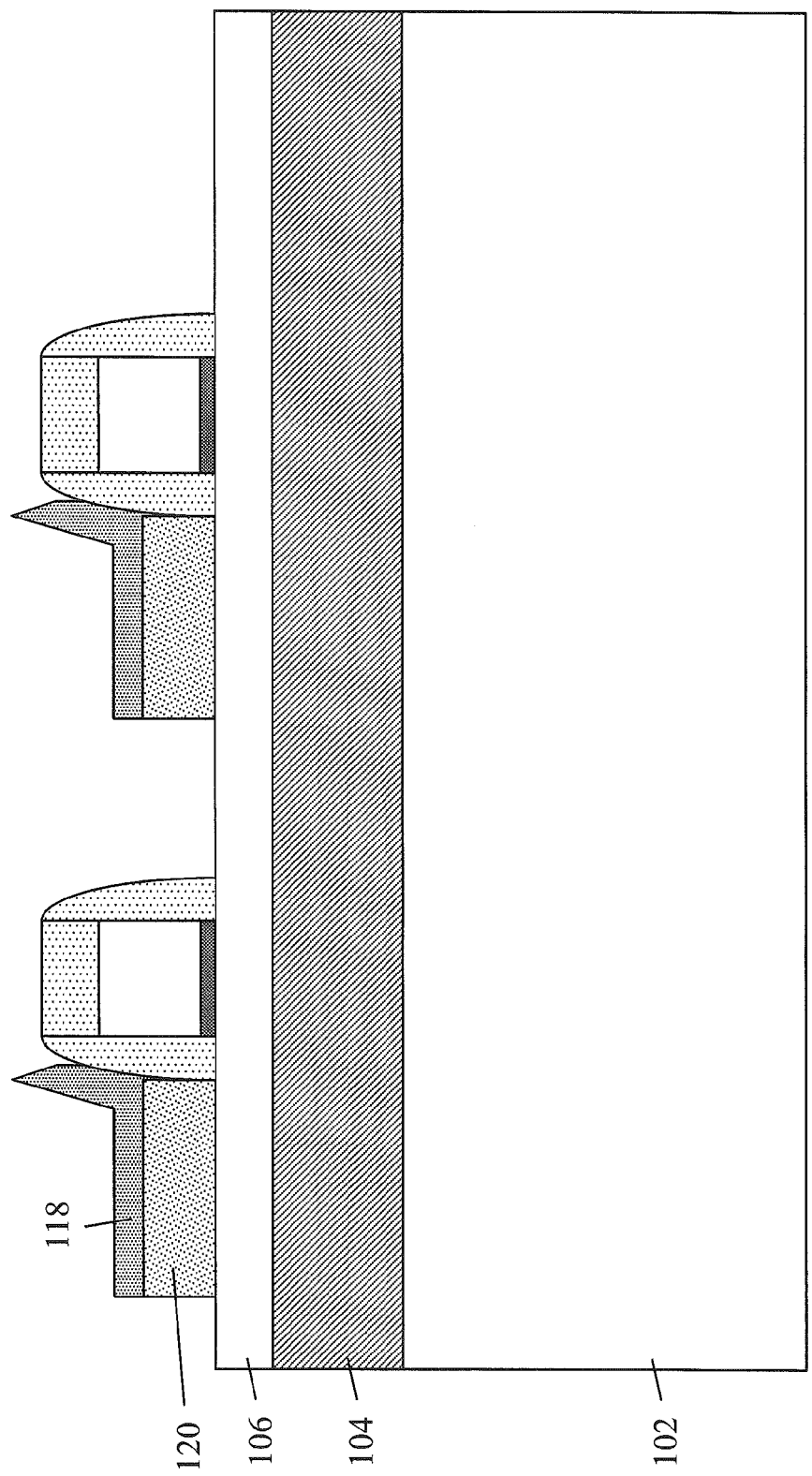
Figure 22:
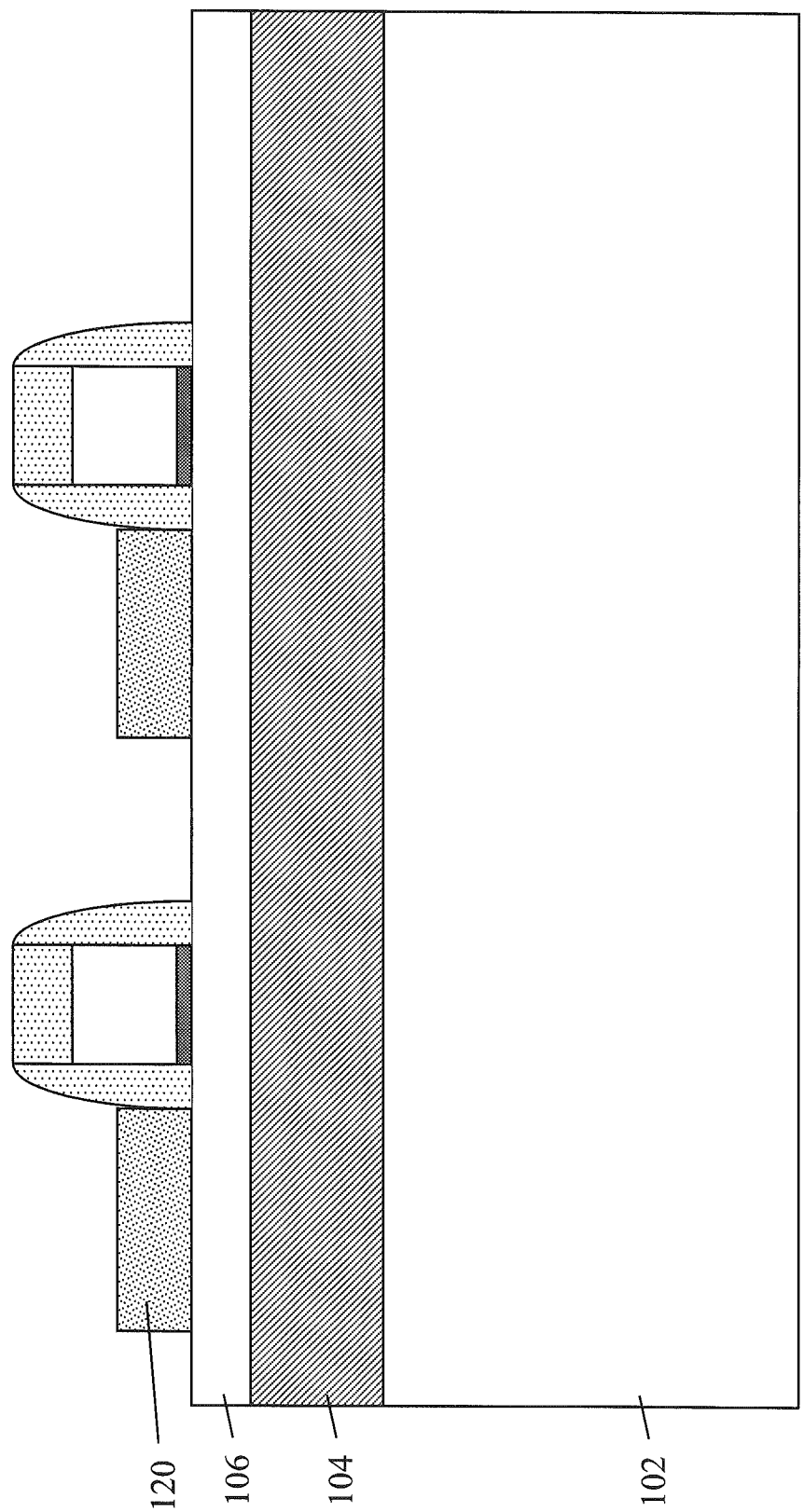
Figure 23:
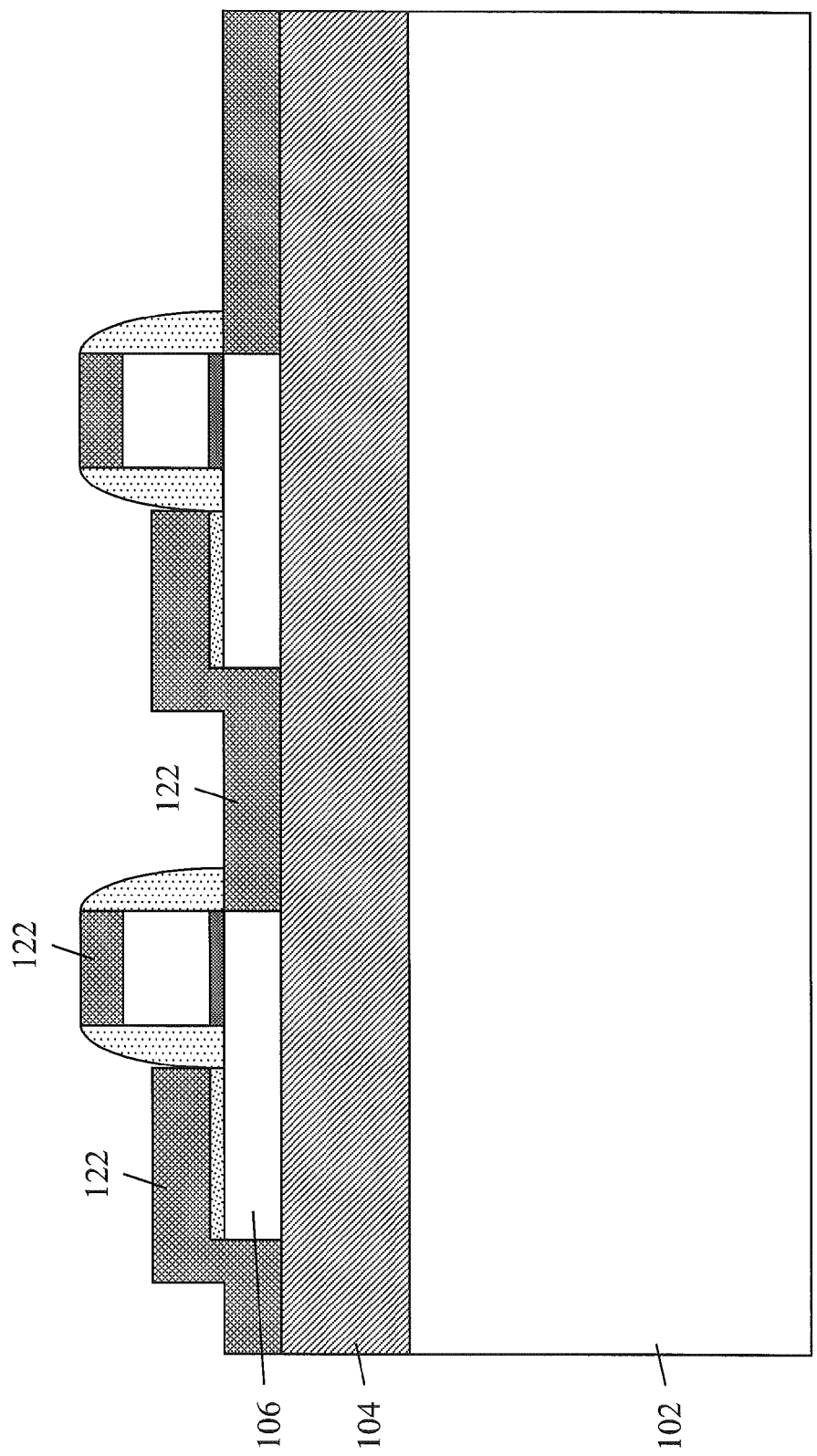

Then, as shown in FIG. 20, an angled implant is used to modify or damage portions 118' of the hardmask layer 118 not shadowed by the gate structures, altering the etch properties thereof. Here, the damaged portions 118' correspond to the drain regions or, stated another way, the undamaged hardmask layer 118 corresponds to the shadowed source regions. In FIG. 21, the damaged portions of the hardmask layer are removed, followed by etching of the exposed portions of the epitaxial semiconductor layer 120, resulting in the raised source regions protected by the remaining hardmask layer 118. Once the raised source regions are defined, the remaining hardmask is removed in FIG. 22. Finally, as shown in FIG. 23, subsequent to the removal of the protective gate hardmask layer, a silicide material 122 is formed over the gate, raised source, and drain regions, thereby forming a hybrid MOSFET structure having a drain side Schottky junction.

As will thus be appreciated, the above described embodiments provide a hybrid MOSFET structure that incorporates a Schottky junction only on the drain side of the FET, where parasitic capacitance is more significant due to the Miller effect. In contrast, a raised ohmic junction is incorporated on the source side where series resistance is more significant. Moreover, through the various tilted implant embodiment, such a hybrid structure may be realized without additional masking steps, is a self-aligned process and is scalable.

Figure 24:
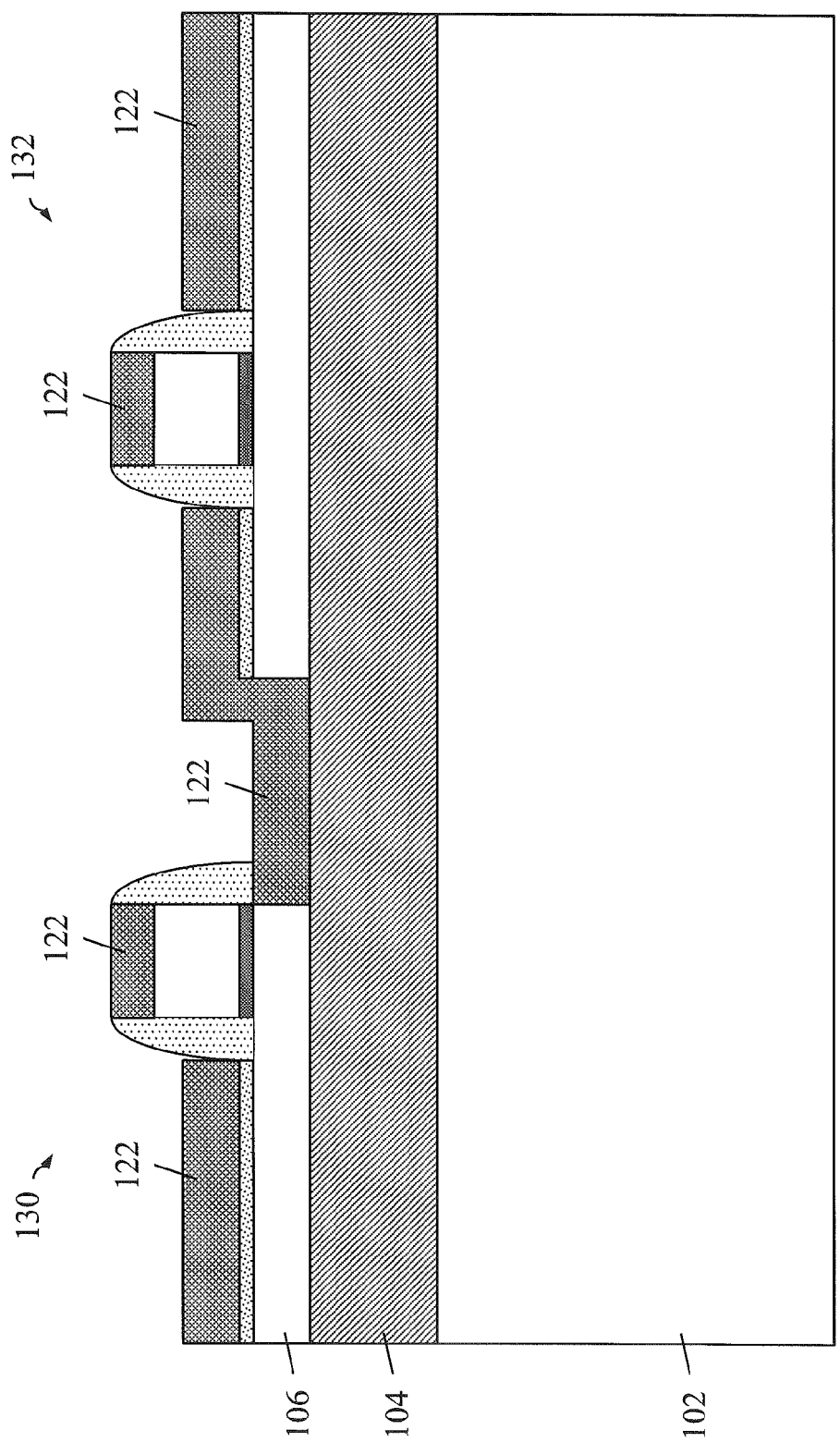
FIG. 24 is a cross sectional view of a hybrid MOSFET device having a drain side Schottky junction integrated with an ohmic MOSFET device, in accordance with a fifth exemplary embodiment.

In addition, such hybrid MOSFET devices may also be integrated with fully ohmic FET devices (i.e., both source and drain contact are ohmic) through suitable masking steps to protect portions of the substrate corresponding to the fully ohmic FET devices while tilted implanting is performed for the portions of the substrate corresponding to the hybrid FET devices. An example of such a structure is illustrated in FIG. 24, which depicts a hybrid MOSFET device 130 integrated with a raised source/drain ohmic MOSFET device 132.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a transistor device, the method comprising:
   forming a patterned gate structure over a semiconductor substrate;
   forming a raised source region over the semiconductor substrate adjacent a source side of the gate structure; and
   forming silicide contacts on the raised source region, on the patterned gate structure, and on the semiconductor substrate adjacent a drain side of the gate structure, thereby defining a hybrid field effect transistor (FET) structure having a drain side Schottky contact and a raised source side ohmic contact;
   wherein a top surface of the Schottky contact of the drain side corresponds to a top surface of the semiconductor substrate.

2. The method of claim 1, further comprising selectively growing an epitaxial semiconductor layer only on the source side of the gate structure so as to form the raised source region.

3. A method of forming a transistor device, the method comprising:
 forming a patterned gate structure over a semiconductor substrate;
 forming a raised source region over the semiconductor substrate adjacent a source side of the gate structure by selectively growing an epitaxial semiconductor layer only on the source side of the gate structure so as to form the raised source region; and
 forming silicide contacts on the raised source region, on the patterned gate structure, and on the semiconductor substrate adjacent a drain side of the gate structure, thereby defining a hybrid field effect transistor (FET) structure having a drain side Schottky contact and a raised source side ohmic contact;
 wherein forming the raised source region further comprises:
 forming a hardmask layer over the patterned gate structure and the semiconductor substrate;
 performing an angled implant so as to alter etch properties of portions the hardmask layer receiving implanted species therein;
 removing the portions of the hardmask altered by the angled implant, so as to expose a portion of the semiconductor substrate corresponding to the source side of the gate structure; and
 growing the epitaxial semiconductor layer only on the source side of the gate structure so as to form the raised source region.

4. The method of claim 3, wherein the angled implant comprises an electrically neutral species implanted under energy and angle conditions designed to localize the species into the hardmask layer.

5. The method of claim 2, wherein forming the raised source region further comprises:
 performing an angled implant so as to alter crystal properties of portions of the semiconductor substrate receiving implanted species therein, corresponding to the drain side of the gate structure; and
 growing the epitaxial semiconductor layer only on the source side of the gate structure, unaltered by the angled implant, so as to form the raised source region.

6. The method of claim 5, wherein the implanted species comprises an neutral dopant species selected to amorphize the semiconductor substrate so as to prevent epitaxial semiconductor material growth thereon.

7. A method of forming a transistor device, the method comprising:
 forming a patterned gate structure over a semiconductor substrate;
 forming a raised source region over the semiconductor substrate adjacent a source side of the gate structure;
 forming silicide contacts on the raised source region, on the patterned gate structure, and on the semiconductor substrate adjacent a drain side of the gate structure, thereby defining a hybrid field effect transistor (FET) structure having a drain side Schottky contact and a raised source side ohmic contact; and
 growing an epitaxial semiconductor layer on the semiconductor substrate and thereafter selectively removing portions of the epitaxial semiconductor layer such that remaining portions thereof are present only on the source side of the gate structure so as to form the raised source region.

8. The method of claim 7, wherein forming the raised source region further comprises:
 growing an epitaxial semiconductor layer on the semiconductor substrate;
 performing an angled implant so as to alter etch properties of portions the epitaxial semiconductor layer receiving implanted species therein; and
 removing the portions of the epitaxial semiconductor layer altered by the angled implant, so as to leave remaining portions thereof only on the source side of the gate structure.

9. The method of claim 8, wherein the angled implant also modifies etch properties of portions of a spacer material of the patterned gate structure receiving implanted species therein.

10. The method of claim 9, further comprising removing a portion of a drain sidewall spacer of the patterned gate structure.

11. The method of claim 7, wherein forming the raised source region further comprises:
 growing an epitaxial semiconductor layer on the semiconductor substrate;
 forming a hardmask layer over the patterned gate structure and the epitaxial semiconductor layer;
 performing an angled implant so as to alter etch properties of portions the hardmask layer receiving implanted species therein;
 removing the portions of the hardmask altered by the angled implant, so as to expose a portion of the epitaxial semiconductor layer corresponding to the source side of the gate structure; and
 removing the exposed portions of the epitaxial semiconductor layer, so as to leave remaining portions thereof only on the source side of the gate structure.

12. The method of claim 11, wherein the angled implant comprises an electrically neutral species implanted under energy and angle conditions designed to localize the species into the hardmask layer.

13. The method of claim 1, wherein the semiconductor substrate comprises a silicon-on-insulator (SOI) substrate.

14. A method of forming a transistor device, the method comprising:
 forming a patterned gate structure over a semiconductor substrate;
 forming a raised source region over the semiconductor substrate adjacent a source side of the gate structure; and
 forming silicide contacts on the raised source region, on the patterned gate structure, and on the semiconductor substrate adjacent a drain side of the gate structure, thereby defining a hybrid field effect transistor (FET) structure having a drain side Schottky contact and a raised source side ohmic contact
 wherein the semiconductor substrate comprises an extremely thin silicon-on-insulator (ETSOI) substrate, having a thickness range of about 4 nanometers (nm) to about 12 nm, and wherein forming the silicide contact on the drain side of the gate structure to define the Schottky contact results in consumption of substantially the entire thickness of the ETSOI substrate.

15. The method of claim 9, further comprising removing a portion of a drain sidewall spacer of the patterned gate structure.

16. A transistor device, comprising:
 a patterned gate structure formed over a semiconductor substrate;

a raised source region formed over the semiconductor substrate adjacent a source side of the gate structure; and silicide contacts formed on the raised source region, on the patterned gate structure, and on the semiconductor substrate adjacent a drain side of the gate structure, thereby defining a hybrid field effect transistor (FET) structure having a drain side Schottky contact and a raised source side ohmic contact;

wherein a top surface of the Schottky contact of the drain side corresponds to a top surface of the semiconductor substrate.

17. The device of claim 16, wherein the semiconductor substrate comprises a silicon-on-insulator (SOI) substrate.

18. A transistor device, comprising:

a patterned gate structure formed over a semiconductor substrate;

a raised source region formed over the semiconductor substrate adjacent a source side of the gate structure; and silicide contacts formed on the raised source region, on the patterned gate structure, and on the semiconductor substrate adjacent a drain side of the gate structure, thereby defining a hybrid field effect transistor (FET) structure having a drain side Schottky contact and a raised source side ohmic contact;

wherein the semiconductor substrate comprises an extremely thin silicon-on-insulator (ETSOI) substrate, having a thickness range of about 4 nanometers (nm) to about 12 nm, and wherein the silicide contact on the drain side of the gate structure to define the Schottky contact extends substantially through the entire thickness of the ETSOI substrate.

19. An integrated circuit device, comprising:

a first transistor and a second transistor formed over a semiconductor substrate, the first transistor comprising a hybrid field effect transistor (FET) structure having a drain side Schottky contact and a raised source side ohmic contact; and the second transistor having both raised source side and drain side ohmic contacts;

wherein a top surface of the Schottky contact of the drain side of the first transistor corresponds to a top surface of the semiconductor substrate.

20. The device of claim 19, wherein the semiconductor substrate comprises a silicon-on-insulator (SOI) substrate.

21. An integrated circuit device, comprising:

a first transistor and a second transistor formed over a semiconductor substrate, the first transistor comprising a hybrid field effect transistor (FET) structure having a drain side Schottky contact and a raised source side ohmic contact; and the second transistor having both raised source side and drain side ohmic contacts;

wherein the semiconductor substrate comprises an extremely thin silicon-on-insulator (ETSOI) substrate, having a thickness range of about 4 nanometers (nm) to about 12 nm, and wherein a silicide contact on a drain side of a gate structure of the first transistor extends substantially through the entire thickness of the ETSOI substrate.

* * * * *